United States Patent
Nakamura et al.

(10) Patent No.: US 12,432,841 B2
(45) Date of Patent: Sep. 30, 2025

(54) DIELECTRIC BARRIER DISCHARGE PLASMA GENERATOR

(71) Applicant: Ushio Denki Kabushiki Kaisha, Tokyo (JP)

(72) Inventors: Kensuke Nakamura, Tokyo (JP); Takahiro Hiraoka, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 85 days.

(21) Appl. No.: 18/689,005

(22) PCT Filed: Feb. 28, 2022

(86) PCT No.: PCT/JP2022/008141
§ 371 (c)(1),
(2) Date: Mar. 4, 2024

(87) PCT Pub. No.: WO2023/037583
PCT Pub. Date: Mar. 16, 2023

(65) Prior Publication Data
US 2024/0381517 A1    Nov. 14, 2024

(30) Foreign Application Priority Data
Sep. 10, 2021 (JP) ................... 2021-147564

(51) Int. Cl.
*H05H 1/24* (2006.01)
(52) U.S. Cl.
CPC ........ *H05H 1/2425* (2021.05); *H05H 1/2439* (2021.05); *H05H 1/2441* (2021.05)
(58) Field of Classification Search
None
See application file for complete search history.

(56) References Cited

U.S. PATENT DOCUMENTS 4,596,946 A * 6/1986 Pottier ............... H05H 9/04
315/5.52
5,225,146 A * 7/1993 Ono ................. G21B 1/057
376/129
(Continued)

FOREIGN PATENT DOCUMENTS

CN   109860006 B  * 11/2020 ............... H05H 7/22
CN   119653577 A  *  3/2025 ............... H05H 7/22
(Continued)

OTHER PUBLICATIONS

Extended European Search Report issued in EP 22 86 6918.0-1211 by the European Patent Office on Nov. 18, 2024, which is related to U.S. Appl. No. 18/689,005.
(Continued)

*Primary Examiner* — Srinivas Sathiraju
(74) *Attorney, Agent, or Firm* — Studebaker Brackett PLLC

(57) ABSTRACT

The dielectric barrier discharge plasma generator includes: a dielectric substrate that exhibits a plate shape extending in a first direction and has a first surface and a second surface located on an opposite side of the first surface in a second direction orthogonal to the first direction; a first electrode disposed on the dielectric substrate on a side of the first surface; a second electrode disposed at a position separated from the second surface of the dielectric substrate in the second direction; a gas flow path that is formed by a gap between the dielectric substrate and the second electrode and through which a gas flows in a third direction orthogonal to the first direction and the second direction; and an outlet provided at a first end which is one end portion of the gas flow path in the third direction.

7 Claims, 27 Drawing Sheets

(56) References Cited

U.S. PATENT DOCUMENTS

| | | | | |
|---|---|---|---|---|
| 6,060,833 | A * | 5/2000 | Velazco | H05H 7/18 |
| | | | | 315/505 |
| 9,228,570 | B2 * | 1/2016 | Roy | F03H 1/0093 |
| 9,282,623 | B2 * | 3/2016 | Roy | H05H 1/247 |
| 10,946,219 | B2 * | 3/2021 | Tahar | A61N 5/1077 |
| 12,028,960 | B2 * | 7/2024 | Ebrahimi | H01F 6/06 |
| 12,219,688 | B2 * | 2/2025 | Hiraoka | H05H 1/245 |
| 2005/0035731 | A1 * | 2/2005 | Secheresse | H05H 1/54 |
| | | | | 315/506 |
| 2007/0176699 | A1 * | 8/2007 | Lida | H05H 13/00 |
| | | | | 331/79 |
| 2012/0304618 | A1 * | 12/2012 | Roy | F03H 1/0037 |
| | | | | 60/203.1 |
| 2013/0038199 | A1 * | 2/2013 | Roy | F04B 19/006 |
| | | | | 313/231.31 |
| 2013/0075382 | A1 * | 3/2013 | Roy | G01M 9/04 |
| | | | | 219/201 |
| 2017/0127506 | A1 * | 5/2017 | Ghomi Marzdashty | |
| | | | | H05H 1/2406 |
| 2017/0137939 | A1 * | 5/2017 | Creyghton | H01J 37/32568 |
| 2017/0181260 | A1 * | 6/2017 | Corke | H05H 1/2439 |
| 2018/0072034 | A1 * | 3/2018 | Wasamoto | B32B 27/16 |
| 2018/0161554 | A1 * | 6/2018 | Takemoto | B29C 66/1122 |
| 2018/0206321 | A1 * | 7/2018 | Morfill | H05H 1/2439 |
| 2019/0070438 | A1 * | 3/2019 | Tahar | H05H 13/085 |
| 2019/0094069 | A1 * | 3/2019 | Xu | H05B 47/11 |
| 2019/0239334 | A1 * | 8/2019 | Aoki | H05H 15/00 |
| 2019/0321499 | A1 * | 10/2019 | Igarashi | A61L 2/26 |
| 2019/0339620 | A1 * | 11/2019 | Nagano | H05G 2/002 |
| 2021/0296094 | A1 * | 9/2021 | Creyghton | H01J 37/32385 |
| 2022/0068627 | A1 * | 3/2022 | Yagyu | H01J 61/547 |
| 2022/0104338 | A1 * | 3/2022 | Ebrahimi | G21B 1/11 |
| 2022/0134303 | A1 * | 5/2022 | Hussey | H05H 1/4697 |
| | | | | 118/723 R |
| 2022/0409755 | A1 * | 12/2022 | Yagyu | H01J 61/16 |
| 2023/0100544 | A1 * | 3/2023 | Hiraoka | H05H 1/245 |
| | | | | 315/111.21 |
| 2023/0158452 | A1 * | 5/2023 | Otsuka | B01D 53/005 |
| | | | | 423/245.3 |
| 2023/0292427 | A1 * | 9/2023 | Hill | A61L 9/22 |
| 2023/0324815 | A1 * | 10/2023 | Yabuta | H05G 2/008 |
| | | | | 355/30 |
| 2024/0268013 | A1 * | 8/2024 | Ebrahimi | F03H 1/0081 |
| 2024/0342679 | A1 * | 10/2024 | Kaneko | C01B 13/10 |
| 2024/0381517 | A1 * | 11/2024 | Nakamura | H05H 1/2439 |
| 2025/0081325 | A1 * | 3/2025 | Tully | H05H 1/54 |

FOREIGN PATENT DOCUMENTS

| | | | | |
|---|---|---|---|---|
| EP | 4346338 | A1 * | 4/2024 | H05H 13/085 |
| EP | 4380319 | A1 * | 6/2024 | H05H 1/2441 |
| EP | 4383955 | A1 * | 6/2024 | H05H 13/00 |
| JP | 2004509432 | A * | 3/2004 | H05H 1/2406 |
| JP | 2008-282784 | A | 11/2008 | |
| JP | 2010-009890 | A | 1/2010 | |
| JP | 2010243501 | A * | 10/2010 | H05H 1/02 |
| JP | 2010277942 | A * | 12/2010 | |
| JP | 6153118 | B2 * | 6/2017 | C23C 16/45563 |
| JP | 2020181752 | A * | 11/2020 | H05H 7/22 |
| JP | 2021-044194 | A | 3/2021 | |
| JP | 2023062318 | A * | 5/2023 | H05H 7/22 |
| KR | 101671625 | B1 * | 11/2016 | H05H 1/2406 |
| KR | 102139415 | B1 * | 7/2020 | H05H 1/2406 |
| KR | 20220046174 | A * | 4/2022 | H05H 1/2406 |

OTHER PUBLICATIONS

International Search Report issued in PCT/JP2022/008141; mailed May 10, 2022.

* cited by examiner

DIELECTRIC BARRIER DISCHARGE PLASMA GENERATOR

TECHNICAL FIELD

The present invention relates to a dielectric barrier discharge plasma generator.

BACKGROUND ART

A plasma generator is used in a manufacturing process for plastic, paper, fiber, semiconductor, liquid crystal, film, or the like. For example, by exposing an object to be treated to plasma from the plasma generator, the following is performed: surface treatment on the surface of the object to be treated to improve hydrophilicity, adhesiveness, printing adhesion, or the like, removal and cleaning of organic substances present on the surface of the object to be treated, or formation of an oxide film on the surface of the object to be treated.

FIG. 18 is a cross-sectional view schematically illustrating a conventional plasma generator. As illustrated in FIG. 18, Patent Document 1 discloses a plasma generator 200 including a pair of electrodes (201, 201) facing each other and having opposing surfaces (202, 202) of the respective electrodes inclined in opposite directions. That is, the pair of opposing surfaces (202, 202) is disposed such that the distance therebetween narrows toward a lower surface opening 226.

The plasma generator 200 applies a voltage between the pair of electrodes (201, 201) while introducing a plasma source gas Gc from an upper surface opening 223, thereby generating many streamer discharges Sd in an area (discharge area 207) sandwiched by the pair of opposing surfaces (202, 202). The plasma source gas Gc is introduced into the discharge area 207 from the upper surface opening 223 through an orifice 225 of an ejection plate 224. Therefore, the plasma source gas Gc is accelerated by the orifice 225 to be ejected into the discharge area 207 at a high speed. By this ejection, a turbulent flow is generated in the plasma source gas Gc, and the streamer discharge Sd is dispersed in the discharge area 207.

Thereafter, plasma Pc is generated substantially uniformly over the entire discharge area 207 by the dispersed streamer discharge Sd. The generated plasma Pc is ejected as a plasma jet into a treatment space 205 through the lower surface opening 226 of the discharge area 207, and is blown onto an object 240 to be treated. Patent Document 1 describes that uniform plasma can be generated by adopting the above configuration.

The upper surface and the opposing surface (202, 202) of the electrodes (201, 201) are covered with a dielectric 203. The thickness of the coating of the dielectric 203 is constant throughout, and is, for example, 0.5 mm to 5 mm.

As another method, a device that generates plasma by inputting microwaves between a microstrip line and a ground conductor is known (cf. Patent Document 2). In this device, impedance matching is performed by making a dielectric layer inclined to adjust the thickness.

PRIOR ART DOCUMENTS

Patent Documents

Patent Document 1: JP-A-2010-009890
Patent Document 2: JP-A-2008-282784

SUMMARY OF THE INVENTION

Problems to be Solved by the Invention

The plasma generator 200 disclosed in Patent Document 1 aims to generate the plasma Pc substantially uniformly over the entire discharge area 207 by generating a turbulent flow. However, for example, the plasma Pc generated at a position far from the lower surface opening 226 in the discharge area 207 disappears while moving toward the lower surface opening 226. Therefore, when the electrodes (201, 201) are disposed in the mode as illustrated in FIG. 18, the plasma Pc blown out from the lower surface opening 226 is not uniformly applied from the entire area of the lower surface opening 226. This causes unevenness in the degree of treatment on the surface of the object 240 to be treated.

A plasma generator disclosed in Patent Document 2 is a technology using microwaves. Plasma generated by microwaves is generated at a high density in an antinode portion of a standing wave having a strong electric field intensity. Standing waves are generated not only in the input direction of the microwaves but also in a direction orthogonal to the input direction. Thus, when the outlet is viewed from the front, and a location where the density of the plasma is high and a location where the density of the plasma is low are alternately generated. Therefore, as for the plasma generated by microwaves, it is not easy to uniformly eject the plasma from the entire area of the outlet.

Furthermore, from the viewpoint of generating standing waves, the device itself cannot be made long in the first place. For this reason, for example, even when the device is intended to be used for the purpose of surface treatment of an object to be treated, its treatment capability is extremely low, and its application is practically difficult.

In view of the above problems, an object of the present invention is to provide a dielectric barrier discharge plasma generator capable of efficiently ejecting plasma uniformly from the entire area of an outlet.

Means for Solving the Problems

A dielectric barrier discharge plasma generator according to the present invention includes: a dielectric substrate that exhibits a plate shape extending in a first direction and has a first surface and a second surface located on an opposite side of the first surface in a second direction orthogonal to the first direction; a first electrode disposed on the dielectric substrate on a side of the first surface; a second electrode disposed at a position separated from the second surface of the dielectric substrate in the second direction; a gas flow path that is formed by a gap between the dielectric substrate and the second electrode and through which a gas flows in a third direction orthogonal to the first direction and the second direction; and an outlet provided at a first end and extending in the first direction, the first end being one end portion of the gas flow path in the third direction, and further exhibits the following features.

The first surface of the dielectric substrate is a flat surface parallel to the third direction, extending at least from a second end to a first reference location, the second end being an end portion opposite to the outlet in the third direction, the second surface of the dielectric substrate is a flat surface parallel to the third direction, extending at least from the second end to a second reference location in the third direction, and a third surface is a flat surface parallel to the third direction, extending at least from the second end to a third reference location in the third direction, and the third surface being a main surface of the second electrode that faces the second surface of the dielectric substrate via the gas flow path.

At least one of the first surface in a first specific area from the first reference location to the first end, the second surface in a second specific area from the second reference location to the first end, or the third surface in a third specific area from the third reference location to the first end is an inclined surface in the third direction.

The first electrode is disposed at least between the first reference location and the first end.

When viewed in the first direction, an angle a formed by the first surface in the first specific area and the third direction, an angle B formed by the second surface in the second specific area and the third direction, and an angle y formed by the third surface in the third specific area and the third direction satisfy both of Formula (1) and Formula (2) below.

[Math 1]

$$\sin \alpha + (\varepsilon_r - 1) \sin \beta - \varepsilon_r \sin \gamma < 0 \quad (1)$$

$$A_\alpha \sin \alpha + d1(0) > A_\beta \sin \beta > A_\gamma \sin \gamma - d2(0) \quad (2)$$

In Formula (1), $\varepsilon_r$ is a relative permittivity of the dielectric substrate. In Formula (2), $A_\alpha$, $A_\beta$, and $A_\gamma$ respectively correspond to lengths of the first specific area, the second specific area, and the third specific area in the third direction, and $d1(0)$ represents a thickness of the dielectric substrate in the second direction at a reference location on a side closer to the second end in the third direction, the reference location being one of the first reference location or the second reference location, and $d2(0)$ represents a height of the gas flow path in the second direction at a reference location on a side closer to the second end in the third direction, the reference location being one of the second reference location or the third reference location).

According to the dielectric barrier discharge plasma generator having the above structure, since the shapes of the dielectric substrate and the electrode are set to satisfy the above Formulas (1) and (2), when the gas flows in the gas flow path in the third direction, the electric field intensity increases toward the outlet. For this reason, an electric field having an extremely high intensity is formed at a location extremely close to the outlet, and plasma is intensively generated in this area. As a result, gas containing plasma can be efficiently blown onto the object to be treated from the outlet, enabling efficient treatment on the object to be treated.

Note that the reason why the electric field intensity increases toward the outlet in the gas flow path by satisfying the above Formulas (1) and (2) will be described later in detail in the section "MODE FOR CARRYING OUT THE INVENTION".

The main material of the dielectric substrate may be aluminum oxide ($Al_2O_3$) or aluminum nitride (AlN).

Here, the term "main material" refers to a component that accounts for 80% or more when constituent materials are subjected to component analysis.

Aluminum oxide and aluminum nitride have relatively low relative permittivity and relatively high physical strength and hardness. Therefore, by using aluminum oxide or aluminum nitride as the main material of the dielectric substrate, the amount of plasma generated per unit power can be increased, and the risk of breakage can be reduced even when the dielectric substrate is made thinner.

Between these materials, aluminum nitride has good thermal conductivity, and can efficiently dissipate the heat of the dielectric substrate. This can inhibit the temperature rise of the electrode on the side to which high voltage is applied (high-voltage side electrode), the electrode being one of the first electrode or the second electrode, thereby reducing stress on the interface between aluminum nitride and the high-voltage side electrode due to thermal expansion. As a result, the life of the dielectric barrier discharge plasma generator is extended.

The first electrode may be a foil-shaped metal. The metal material is not limited, but a material having high conductivity is preferable, and a typical example thereof is one or more materials belonging to the group consisting of copper, silver, aluminum, and gold, or a compound of the materials described above.

The first electrode may be a sintered body containing metal. The sintered body containing metal can be formed by printing a metal paste for the electrode, thus eliminating the need to use an adhesive when the first electrode is formed on the dielectric substrate.

The first electrode may be formed by plating, vapor deposition, sputtering, or thermal spraying. Similarly in the case of this configuration, it is not necessary to use an adhesive when the first electrode is formed on the dielectric substrate.

The dielectric substrate may exhibit a shape in which a thickness of the dielectric substrate in the second direction is constant regardless of a position in the third direction, or a thickness of the dielectric substrate in the second direction gradually increases from the first reference location toward the first end.

The first electrode may be a high-voltage side electrode, and the second electrode may be a low-voltage side electrode.

In this case, the dielectric barrier discharge plasma generator may include a power supply device connected to the first electrode. The power supply device preferably has a configuration capable of supplying the first electrode with a voltage signal having a voltage of 3 kV to 20 kV and a frequency of 20 kHz to 150 kHz.

When the power supply device as described above is provided, plasma can be suitably generated by a dielectric barrier discharge method. The reason why the upper limit is set to 150 kHz is that the wavelength is set in consideration of the plasma irradiation length, and the frequency detected in a noise terminal voltage according to the electromagnetic compatibility (EMC) standard is higher than 150 kHz.

The dielectric barrier discharge plasma generator may further include: a gas buffer substrate in contact with the second electrode at a peripheral edge from a position opposite to the dielectric substrate; a gas delivery device that introduces the gas into a gap sandwiched between the gas buffer substrate and the second electrode; and a plurality of contact holes penetrating the second electrode in the second direction at each of a plurality of locations that differ in the first direction.

With the above configuration, the gas introduced from the gas delivery device is stored in the gap sandwiched between the gas buffer substrate and the second electrode, and then flows into the gas flow path through the plurality of contact holes. This enables the gas flowing into the gas flow path to uniformly flow out from the outlet without disturbing the flow of the gas.

In particular, the contact holes are provided at a plurality of locations in the first direction, so that gas is introduced into the gas flow path from a plurality of different positions in the first direction. This facilitates the gas flowing through the gas flow path to be transformed into a laminar flow.

In the above, the plurality of contact holes may be located closer to the second end side than the first electrode in the third direction.

The first electrode may be disposed at a position retracted from the first end toward the second end by a distance of less than $d1(0)$ in the third direction.

Near the outlet, there is a risk of direct discharge between the first electrode and the second electrode without the dielectric substrate interposed therebetween. When such discharge occurs, the first electrode, the second electrode, or the dielectric substrate may be damaged, and at this time, these constituent materials may be mixed in the plasma as impurities and adhere to the surface of the object to be treated.

From the viewpoint of discharge efficiency, it is advantageous to dispose the first electrode so that the end portion of the first electrode coincides with the leading end (first end) of the outlet in the third direction. However, in the case of such an arrangement mode, creeping discharge may occur on the dielectric substrate due to the above circumstances. Once this creeping discharge occurs, direct discharge, rather than dielectric barrier discharge, becomes dominant, and excessive discharge current flows, resulting in damage to the electrode and eventually to the power supply device.

In contrast, adopting the above configuration inhibits direct discharge between the first electrode and the second electrode, so that damage to the electrode and the dielectric substrate is inhibited, and the entry of impurities into the plasma gas can be prevented.

The dielectric barrier discharge plasma generator may further include a startup assist member disposed on the second surface in the second specific area. Preferably, the startup assist member is disposed very near the outlet, that is, near the first end. However, when the startup assist member and the outlet are arranged so that the positions of the startup assist member and the outlet are aligned as viewed in the first direction, a part of the plasma gas from the startup assist member and the outlet collides with the startup assist member, whereby the startup assist member may be worn and removed. On the other hand, when the startup assist member is too far from the outlet in the third direction, its function as a start assist is not achieved originally. From this viewpoint, the startup assist member is preferably disposed near the outlet and at a position slightly retracted to the second end in the third direction. The retraction distance is preferably less than 10 mm, and more preferably less than a distance obtained by subtracting the thickness of the dielectric substrate on the first end side (corresponding to a distance $d1a$ in FIG. 8 to be described later) from 10 mm (that is, $10-d1a$).

While dielectric barrier discharge requires high power at startup (when discharge starts), once the discharge occurs, the discharge can be maintained even with reduced input power thereafter. Due to such circumstances, preferably, high power is supplied at startup. However, such a method requires a large power supply device compatible with high power and a trigger electrode disposed near the discharge space, and there is a concern of an increase in the overall size of the device.

At the start of plasma discharge, initial electrons need to be present at a location where plasma is generated. Therefore, when the startup assist member is disposed as in the above configuration, the initial electrons are supplied into the gas flow path near the outlet at the initial stage of startup. This eliminates the need for a large power supply device, a trigger electrode, and the like and enables provision of a small and inexpensive plasma generator.

Effect of the Invention

According to the dielectric barrier discharge plasma generator of the present invention, plasma can be efficiently ejected uniformly from the entire area of the outlet.

MODE FOR CARRYING OUT THE INVENTION

Figure 1:
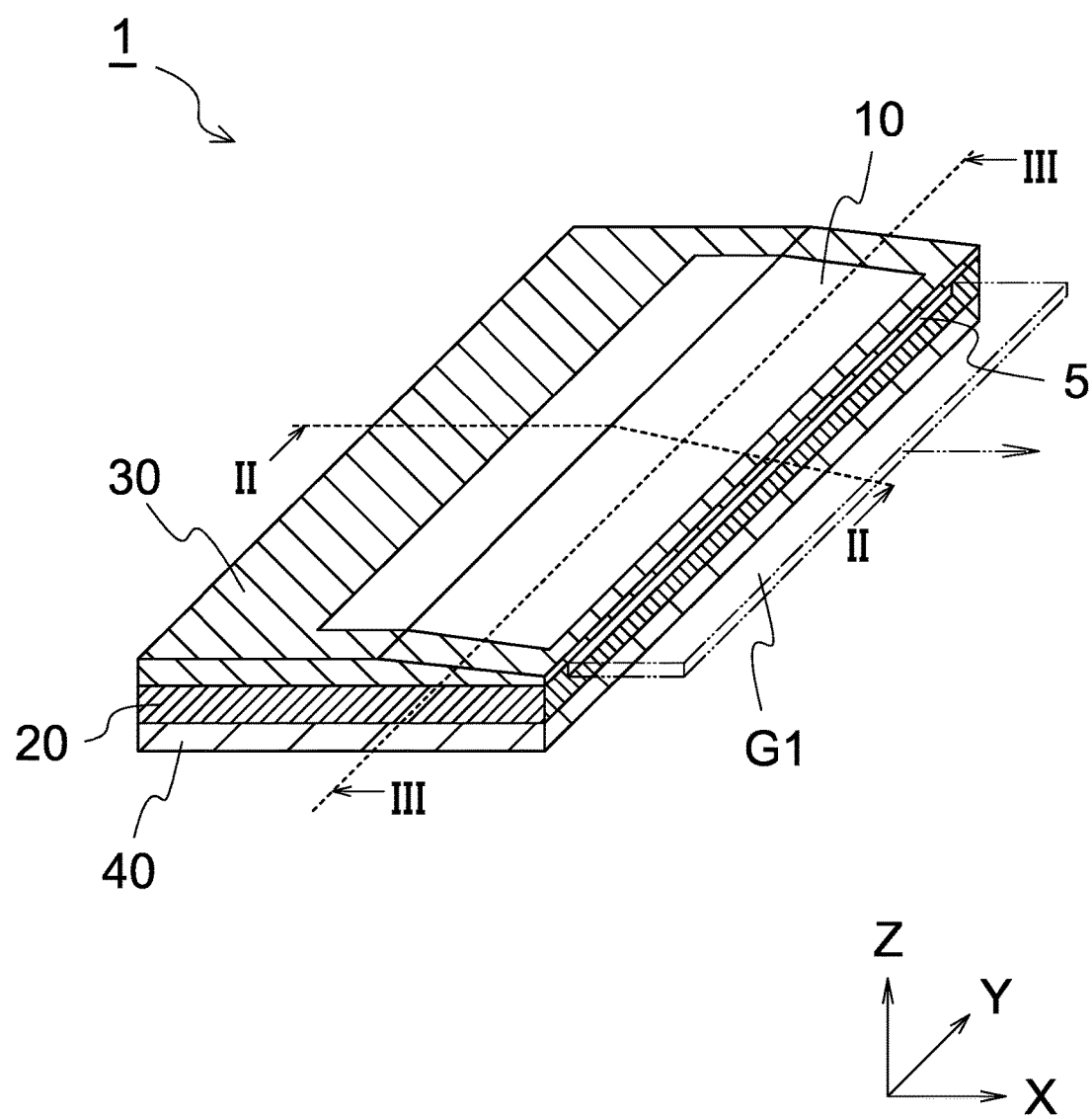
FIG. 1 is a perspective view schematically illustrating a configuration of one embodiment of a dielectric barrier discharge plasma generator of the present invention.

An embodiment of the dielectric barrier discharge plasma generator according to the present invention will be described with reference to the drawings as appropriate. Note that the drawings referred to below are schematic illustrations, and the dimensional ratios in the drawings are not necessarily the same as the actual dimensional ratios. Further, the dimensional ratios may not always be the same among the drawings.

Structure

FIG. 1 is a perspective view schematically illustrating a dielectric barrier discharge plasma generator according to the present embodiment. A dielectric barrier discharge plasma generator 1 (hereinafter abbreviated as a "plasma generator 1") includes a first electrode 10, a second electrode 20, and a dielectric substrate 30. Note that the plasma generator 1 illustrated in FIG. 1 further includes a gas buffer substrate 40. However, including the gas buffer substrate 40 in the plasma generator 1 is optional.

The plasma generator 1 is a device that generates a plasma gas G1 inside, and includes an outlet 5 that blows out the plasma gas G1. As illustrated in FIG. 1, the outlet 5 extends in the Y direction and exhibit a substantially rectangular shape as viewed in the X direction. Note that a direction orthogonal to the X direction and the Y direction is defined as a Z direction. In the following description, an X-Y-Z coordinate system added to FIG. 1 will be referred to as appropriate.

In the following description, when positive and negative directions are distinguished at the time of expressing directions, the directions are described with a positive or negative symbol, such as "+X direction" or "−X direction". When the direction is expressed without distinguishing between positive and negative direction, the direction is simply described as "X direction". Namely, in the present specification, when the direction is simply described as "X direction", both "+X direction" and "−X direction" are included. The same applies to a Y direction and a Z direction.

In the present specification, the Y direction corresponds to a "first direction", the Z direction corresponds to a "second direction", and the X direction corresponds to a "third direction".

Figure 2:
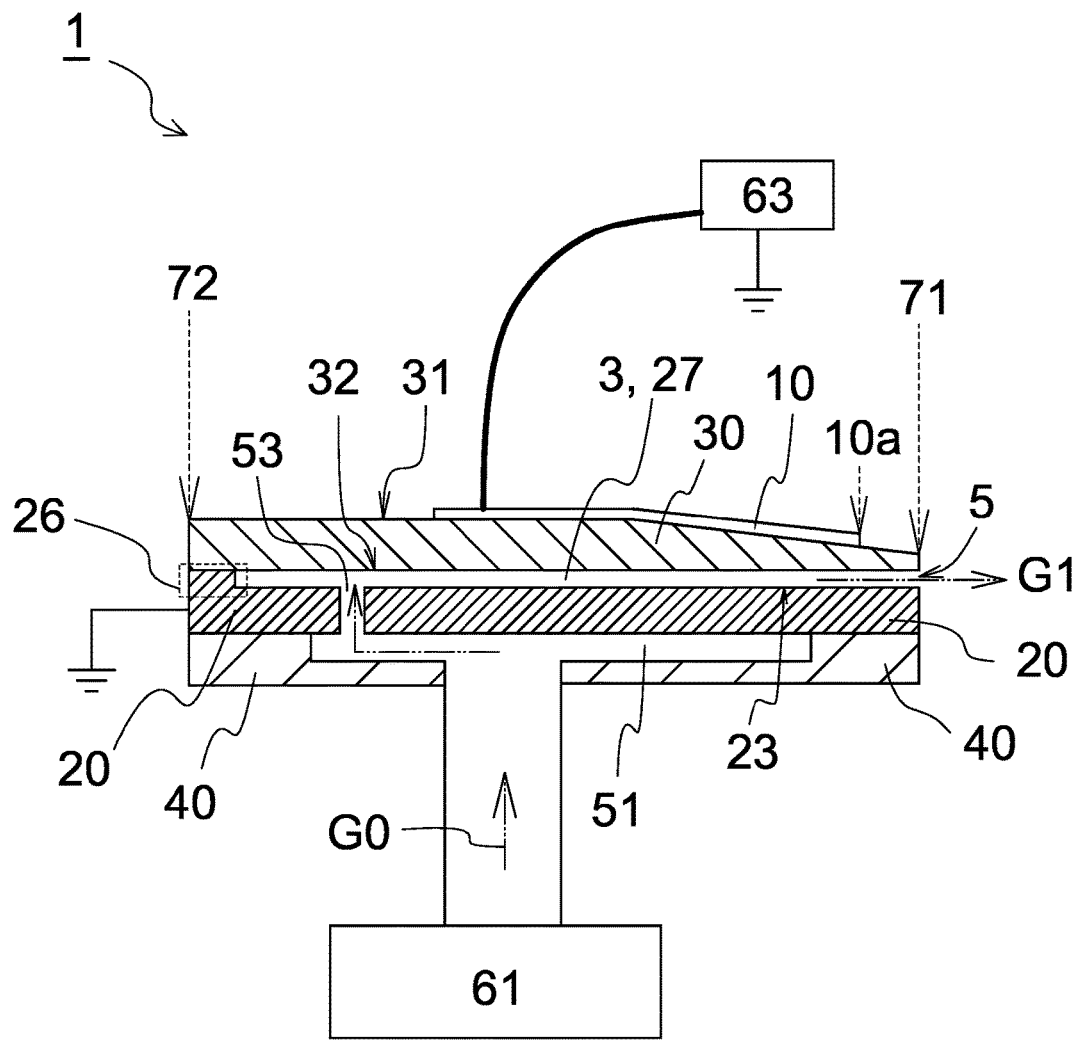
FIG. 2 is a schematic cross-sectional view of the plasma generator illustrated in FIG. 1 taken along line II-II.
Figure 3:
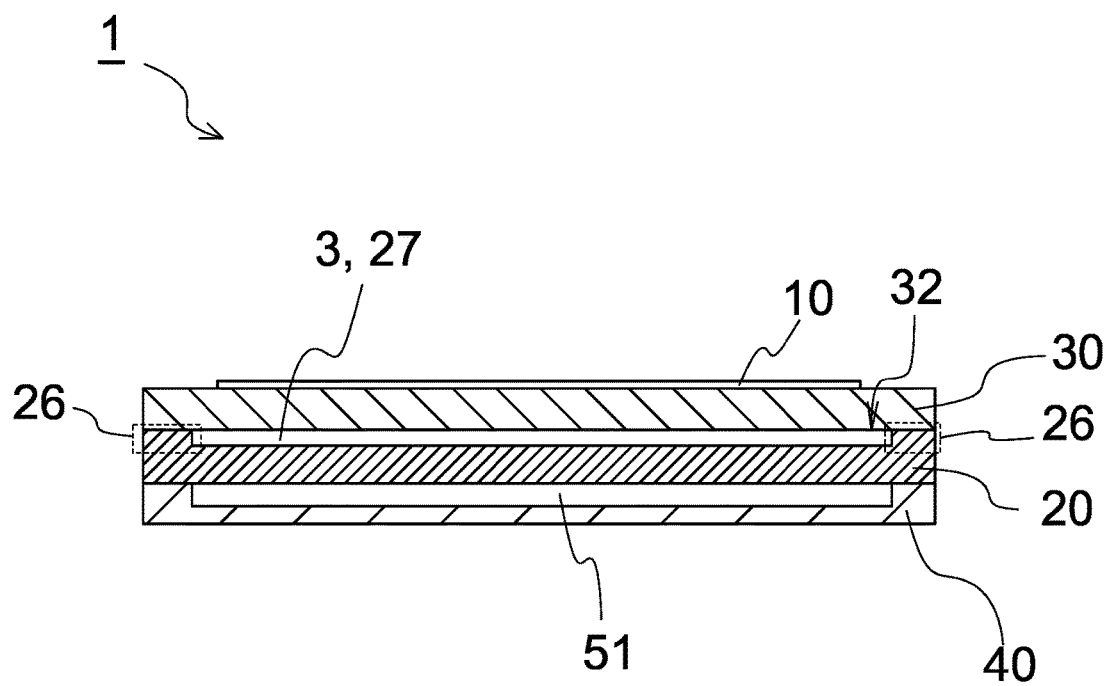
FIG. 3 is a schematic cross-sectional view of the plasma generator illustrated in FIG. 1 taken along line III-III.
Figure 3:
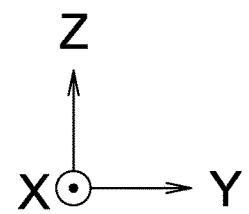

FIG. 2 is a schematic cross-sectional view of the plasma generator 1 illustrated in FIG. 1 taken along line II-II. FIG. 3 is a schematic cross-sectional view of the plasma generator 1 illustrated in FIG. 1 taken along line III-III.

(Dielectric Substrate 30)

As illustrated in FIGS. 1 to 3, the dielectric substrate 30 is a plate-like member extending in the Y direction. The dielectric substrate 30 has a first surface 31 and a second surface 32 (cf. FIG. 2). As described later, the first electrode 10 is disposed on the first surface 31 side of the dielectric substrate 30, and the second electrode 20 is disposed at a position separated from the dielectric substrate 30 in the second surface 32 side.

In the examples illustrated in FIGS. 1 and 2, a structure is adopted in which the length (hereinafter referred to as "thickness") of the dielectric substrate 30 in the Z direction becomes thinner toward the outlet 5 in the X direction, but this structure is merely an example. The thickness of the dielectric substrate 30 will be described later in detail with reference to FIG. 8.

The dielectric substrate 30 is preferably made of a material having a low relative permittivity from the viewpoint of further increasing the amount of plasma generated per unit power. The value of the relative permittivity of the material is preferably 10 or less. Note that the relative permittivity of the material is preferably as low as possible, but can be typically set to 4 to 10.

The material of the dielectric substrate 30 is not particularly limited, but is preferably a material having a relative permittivity as low as possible as described above. Furthermore, from the viewpoint of durability, the material is preferably ceramic. Examples of the ceramic include aluminum oxide, aluminum nitride, steatite, and the like. These materials have relatively low relative permittivity, relatively high strength, and excellent durability. Therefore, forming the dielectric substrate 30 with aluminum oxide, aluminum nitride, or steatite further increases the amount of plasma generated per unit power. In addition, the dielectric substrate 30 has excellent durability, thereby reducing the risk of breakage even when its thickness is decreased.

The dielectric substrate 30 may contain a substance that assists electron generation with the material described above as a base material. Examples of the substance that assists electron generation include silver, platinum, copper, carbon, a transition metal compound, and the like. When an electric field is applied to the substance that assists electron generation, initial electrons are generated and emitted into a discharge space (a gas flow path 3 to be described later). Therefore, forming the dielectric substrate 30 with the configuration as described above can work to the advantage of startup performance.

The content of the substance that assists electron generation is preferably 1 mass % or less in the entire dielectric substrate 30 (assuming that the dielectric substrate 30 is 100 mass %). When the content of the substance is excessively large, there is a concern that the substance will evaporate and scatter with discharge, mix into the plasma gas G1, and be blown onto an object to be treated, which will be exposed to the plasma gas G1. From the viewpoint of sufficiently expressing the effect of improving startup performance, the content of the substance is experimentally preferably 0.05 mass % or more.

(First Electrode 10)

As illustrated in FIG. 2, the first electrode 10 is disposed on the first surface 31 of the dielectric substrate 30.

The plasma generator 1 generates the plasma gas G1 by applying a voltage between the first electrode 10 and a second electrode 20, described later, via the dielectric substrate 30 and the gas flow path 3 to turn the gas flowing in the gas flow path 3 into plasma. Therefore, one of the first electrode 10 or the second electrode 20 is a high-voltage side electrode, and the other constitutes a low-voltage side electrode. In the following embodiment, a description will be given assuming that the first electrode 10 is the high-voltage side electrode and the second electrode 20 is the low-voltage side electrode, but the two may be reversed.

As illustrated in FIGS. 1 and 3, in the present embodiment, the first electrode 10 has a length in the Y direction (hereinafter referred to as "width") substantially equal to the width of the dielectric substrate 30. The plasma generator 1 generates plasma on the −Z side of the area where the first electrode 10 is provided. Hence it is preferable to form the first electrode 10 as wide as possible from the viewpoint of wide ejection of the plasma gas G1 from the outlet 5 (to an area long in the Y direction). However, the present invention is not limited to the width of the first electrode 10.

In the present embodiment, the first electrode 10 is slightly retracted to the −X side from the outlet 5 in the X direction. That is, referring to FIG. 2, an +X-side end portion 10a of the first electrode 10 is slightly retracted to the −X side from the end portion of the plasma generator 1 on the outlet 5 side (+X side). For convenience, the end portion of the plasma generator 1 on the outlet 5 side (+X side) may be referred to as a "first end 71", and the end portion of the plasma generator 1 on the opposite side (−X side) to the outlet 5 may be referred to as a "second end 72".

Near the outlet 5, there is a risk of direct discharge between the first electrode 10 and the second electrode 20 without the dielectric substrate 30 interposed therebetween. When such discharge occurs, the electrode (10, 20) or the dielectric substrate 30 is damaged, and these constituent materials are mixed into the plasma gas G1 as impurities.

From the viewpoint of discharge efficiency, it is preferable that the +X-side end portion 10a of the first electrode 10 be as close to the outlet 5 as possible, that is, almost coincident with the first end 71. However, when such a configuration is adopted, a risk of occurrence of creeping discharge between the first electrode 10 and the second electrode 20 increases, and direct discharge rather than dielectric barrier discharge becomes dominant. Therefore, as described above, the configuration in which the +X-side end portion 10a of the first electrode 10 is slightly retracted from the first end 71 to the −X side (second end 72 side) is adopted. The retraction distance, that is, the distance between the +X-side end portion 10a of the first electrode 10 and the first end 71 is 1 mm to 5 mm as a typical example.

The material of the first electrode 10 is not particularly limited, but is preferably one having high conductivity, and a typical example thereof is one or more materials belonging to the group consisting of copper, silver, aluminum, and gold, or a compound of the above materials. In addition, the first electrode 10 may be a foil-shaped metal. Examples thereof include metal foils such as copper foils and aluminum foils with one surface subjected to adhesive processing.

The first electrode 10 may be a sintered body containing a conductive metal. Since the sintered body containing the metal can be formed by printing a metal paste on the first surface 31 of the dielectric substrate 30, it is not necessary to use an adhesive at the time of manufacturing. From the viewpoint of not using an adhesive, the first electrode 10 can also be formed by plating, vapor deposition, sputtering, or thermal spraying.

Preferably, the first electrode 10 and the dielectric substrate 30 (first surface 31) adhere to each other as closely as possible, and there is no layer of air at the interface therebetween. This is because, when there is a layer of air, discharge may occur inside the space, and the first electrode 10 may deteriorate due to the generated radicals generated may degrade the first electrode 10. For this reason, it is preferable that the first electrode 10 and the dielectric substrate 30 closely adhere to each other with a separation distance therebetween in the range of the order of μm. As will be described later with reference to FIG. 16, from the viewpoint of enhancing adhesion between the two, the surface of the first surface 31 of the dielectric substrate 30 may be roughened to form minute irregularities aiming at an anchor effect.

Typically, the length of the first electrode 10 in the Z direction (hereinafter referred to as "thickness") is thinner than the thickness of the dielectric substrate 30. In particular, by using the first electrode 10 as the high-voltage side electrode, even when the material of the first electrode 10 expands with the application of high voltage, the impact of the expansion on the dielectric substrate 30 is minor due to the small thickness of the first electrode 10.

When the first electrode 10 is the high-voltage side electrode, a part of the first electrode 10 is connected to the power supply device 63. A method for connection between the power supply device 63 and the first electrode 10 is not particularly limited as long as the connection is made electrically and can withstand the applied voltage.

Examples thereof include connection by solder and connection using various connectors (e.g., a coaxial connector or the like). In the plasma generator 1 of the present embodiment, microwaves are not used in plasma generation, and it is thus not necessary to use a coaxial connector or a coaxial cable having a predetermined characteristic impedance.

The voltage and the frequency applied from the power supply device 63 to the first electrode 10 need only be in a range where the dielectric barrier discharge can be generated in the plasma generator 1. Typically, the applied voltage is 3 kV to 20 kV, preferably 3 kV to 10 kV. The frequency of the voltage signal is typically 20 kHz to 1000 kHz, and more preferably 50 kHz to 150 kHz. The reason why the upper limit is preferably 150 kHz is that the wavelength is set in consideration of the plasma irradiation length, and the frequency detected in a noise terminal voltage according to the electromagnetic compatibility (EMC) standard is higher than 150 KHz.

(Second Electrode 20)

The second electrode 20 exhibits a plate shape extending in the Y direction, and is disposed at a position separated from the second surface 32 of the dielectric substrate 30 in the Z direction. When the second electrode 20 is the low-voltage side electrode, the second electrode may be connected to the ground potential directly or via a resistor, or may be connected to the low-voltage side output of the power supply device 63.

As illustrated in FIGS. 2 and 3, a recess 27 is formed in a part of the +Z-side surface of the second electrode 20. The recess 27 is formed extending in the Y direction.

Figure 4:
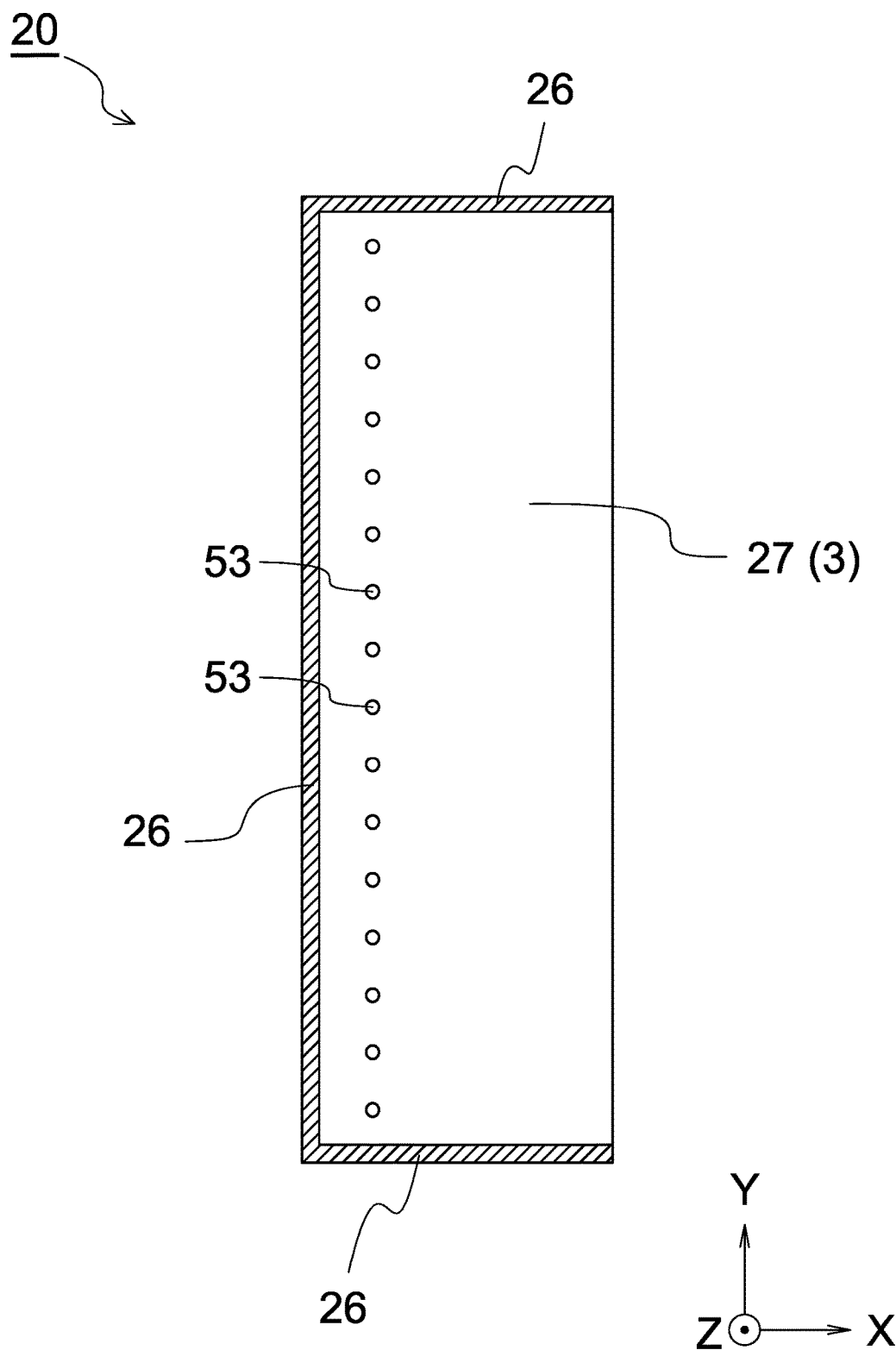
FIG. 4 is a schematic plan view of a second electrode 20 as viewed from the +Z side.

FIG. 4 is a schematic plan view of the second electrode 20 as viewed from the +Z side. It can be seen from FIGS. 2 to 4 that the second electrode 20 is high at an outer edge 26 on the +Y side, the −Y side, and the −X side, and the recess 27 is formed inside the outer edge 26. As illustrated in FIGS. 2 to 3, the outer edge 26 of the second electrode 20 is in contact with the second surface 32 of the dielectric substrate 30. That is, when the outer edge 26 of the second electrode 20 and the dielectric substrate 30 are brought into contact with each other, the recess 27 formed on the +Z side of the second electrode 20 forms a gap. This gap constitutes the "gas flow path 3".

In the example illustrated in FIG. 4, contact holes 53 are formed at a plurality of positions separated in the Y direction on the bottom surface of the recess 27. The number of the contact holes 53 is not particularly limited, but is preferably two or more as in the present embodiment. The contact hole 53 is provided to guide the gas G0 from the gas delivery device 61 to the gas flow path 3 as described later. Providing the plurality of contact holes 53 at various positions in the Y direction facilitates the gas flowing in the gas flow path 3 to be transformed into a laminar flow. From the viewpoint of spreading the gas in a wide range in the Y direction at the time of introduction into the gas flow path 3, the contact holes 53 are preferably formed in a wide range in the Y direction.

Although FIG. 4 illustrates an example in which a plurality of independent contact holes 53 are formed, a single contact hole 53 long in the Y direction, that is, having a rectangular cylindrical shape, may be formed.

(Gas Buffer Substrate 40)

As illustrated in FIGS. 1 to 3, the plasma generator 1 includes the gas buffer substrate 40 that is brought into contact with the second electrode 20 from a position opposite to the dielectric substrate 30, that is, from the −Z side. In the present embodiment, the gas buffer substrate 40 is in contact with the second electrode 20 at the peripheral edge. Therefore, a gap 51 is formed between the second electrode 20 and the gas buffer substrate 40 inside the peripheral edge.

A gas delivery device 61 (cf. FIG. 2) is connected to the gap 51. When a treatment gas G0 is delivered from the gas delivery device 61, the treatment gas G0 is buffered in the gap 51 and then guided to the gas flow path 3 through the contact hole 53.

(Outlet 5)

The plasma generator 1 includes the outlet 5 at the +X-side end portion of the gas flow path 3, that is, the first end 71. The outlet 5 ejects plasma, generated during flowing in the gas flow path 3 along the +X direction, to the outside along with a gas flow (plasma gas G1). In the plasma generator 1, as an example, the widths (the lengths in the Y direction) of the gas flow path 3 and the outlet 5 are uniform regardless of the X coordinate. This enables the plasma gas G1 to be uniformly ejected from the outlet 5 without disturbing the flow of the treatment gas G0 flowing into the gas flow path 3. Note that this has also been confirmed by simulation by the present inventors.

However, the present invention is not limited to this example, and the width of the outlet 5 may be adjusted as necessary. For example, the intensity of the plasma gas G1 is increased by narrowing the width of the outlet 5 compared to the width of the gas flow path 3 on the −X side (second end 72 side). Conversely, by widening the width of the outlet 5 compared to the width of the gas flow path 3 on the −X side (the second end 72 side), the ejection width of the plasma gas G1 can be widened, and the range in which the plasma gas G1 can be simultaneously blown onto the object to be treated can be extended.

Examples of the gas delivered from the gas delivery device 61 at the startup of the plasma generator 1 include one or more selected from the group consisting of He, Ne, and Ar. Examples of the gas after generation of plasma include a gas capable of generating a desired active species, specifically, one or more selected from the group consisting of hydrogen, oxygen, water, nitrogen, and the like.

In the present embodiment, the flow of the gas flowing through the gas flow path 3 is preferably a laminar flow. When the gas flow is a laminar flow, the plasma can be more uniformly ejected. Here, as a parameter for distinguishing between a laminar flow and a turbulent flow, the Reynolds number is used.

The Reynolds number Re is a dimensionless quantity represented by:

$$Re = \rho \cdot U \cdot L / \mu,$$

where and the density of the fluid is $\rho(kg//m^3)$, the flow rate is $U(m/s)$, the characteristic length is $L(m)$, and the viscosity coefficient of the fluid is $\mu(Pa \cdot s)$.

The Reynolds number that is the boundary between the laminar flow and the turbulent flow is called a critical Reynolds number, and its value is said to be 2000 to 4000.

In the plasma generator 1 used in Example 1 to be described later, assuming that the flow rate of the treatment gas G0 is 0.005 m³/sec (300 L/min), the height (short side) of the gas flow path 3 in the Z direction is 0.5 mm, and the width (long side) of the gas flow path 3 in the Y direction is 700 mm, and when $U=14.3$ (m/sec), $L=9.99\times10^4$ (m), and $\rho=1.205$ (kg/m³) and $\mu=1.822\times10^{-5}$ (Pa·s) with the fluid as dry air at standard atmospheric pressure, the Reynolds number is about 945. This is a value equal to or less than the limit Reynolds number, and the flow can be determined as a laminar flow.

Relationship Between Shapes of Dielectric Substrate 30 and Second Electrode 20

Next, the shapes of the dielectric substrate 30 and the second electrode 20 will be described.

Figure 5A:
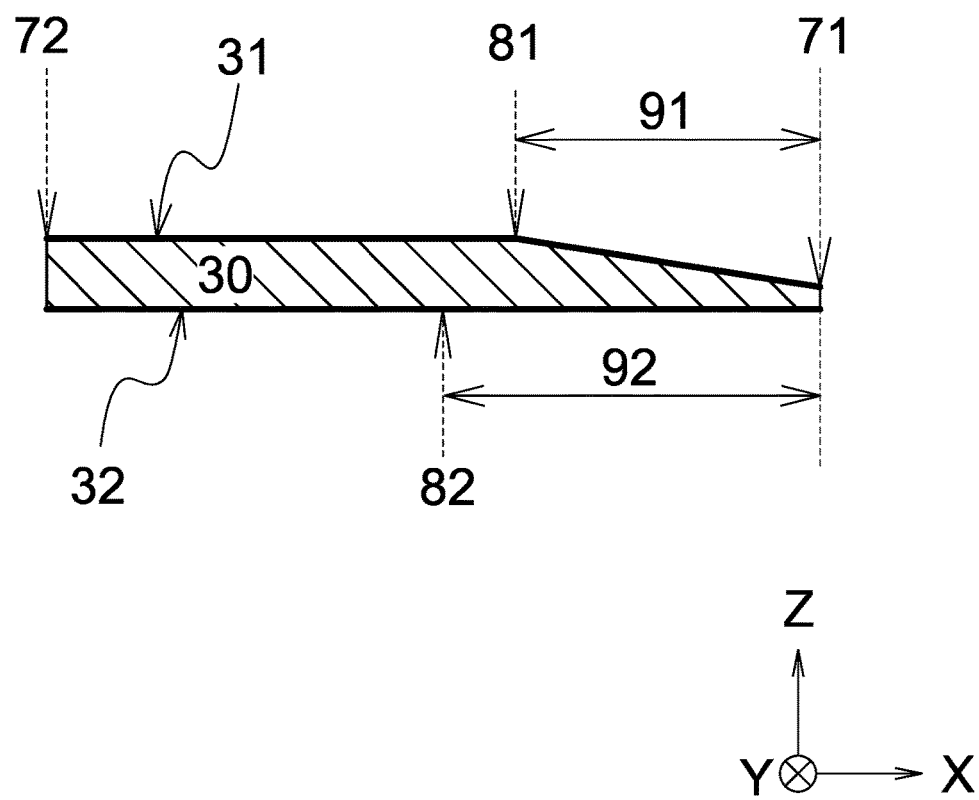
FIG. 5A is an enlarged cross-sectional view obtained by extracting a dielectric substrate 30 from FIG. 2.

FIG. 5A is an enlarged view obtained by extracting only the dielectric substrate 30 from the drawing illustrated in FIG. 2. For the convenience of description, it may be illustrated with exaggeration particularly in the following drawings.

As described above, the dielectric substrate 30 has the first surface 31 on the +Z side and the second surface 32 on the −Z side. In the example illustrated in FIG. 5A, in the first surface 31, an area from the second end 72 to a predetermined location (referred to as a "first reference location 81") in the X direction is a flat surface parallel to the X direction, and an area from the first reference location 81 to the first end 71 (referred to as a "first specific area 91") is a surface inclined in the X direction. In contrast, the second surface 32 of the dielectric substrate 30 illustrated in FIG. 5A is a flat surface parallel to the X direction regardless of the position of the X coordinate.

Figure 5B:
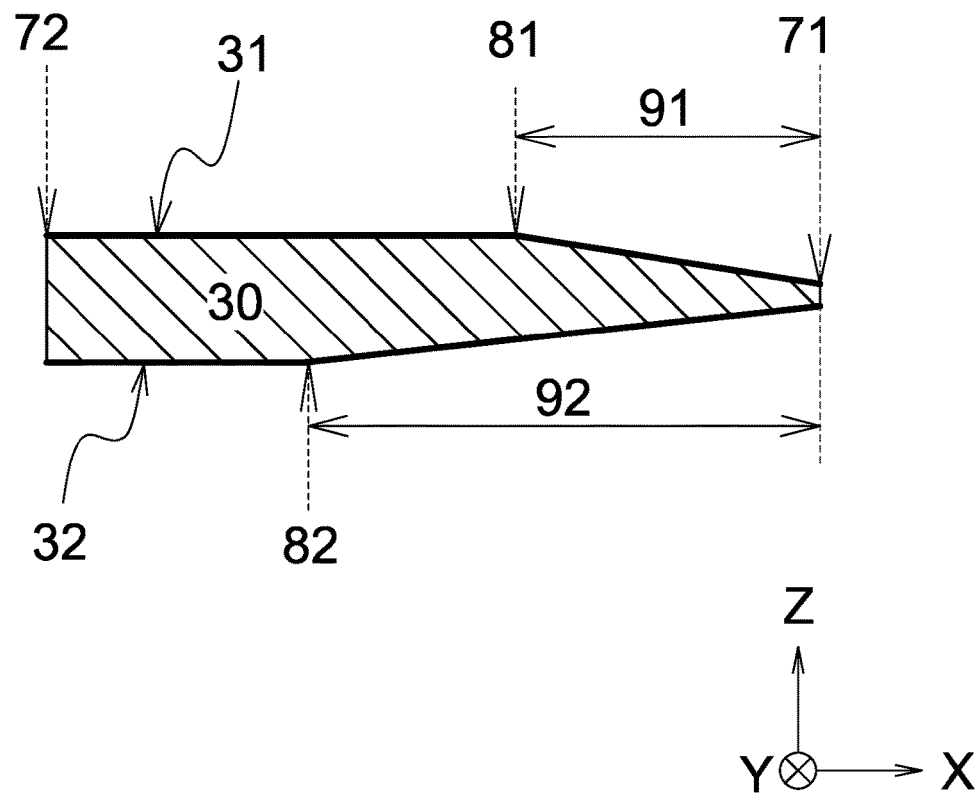
FIG. 5B is a cross-sectional view illustrating another configuration example of the dielectric substrate 30 in the same manner as FIG. 5A.

However, in the present embodiment, it is not excluded that the second surface 32 of the dielectric substrate 30 has an inclined surface. For example, in the example illustrated in FIG. 5B, in the second surface 32 of the dielectric substrate 30, an area from the second end 72 to a predetermined location (referred to as a "second reference location 82") in the X direction is a flat surface parallel to the X direction, and an area from the second reference location 82 to the first end 71 (referred to as a "second specific area 92") is a surface inclined in the X direction. In the first surface 31 of the dielectric substrate 30 illustrated in FIG. 5B, similarly to FIG. 5A, an area from the second end 72 to the first reference location 81 is a flat surface parallel to the X direction, and an area from the first reference location 81 to the first end 71 (first specific area 91) is a surface inclined in the X direction.

That is, in the plasma generator 1 of the present embodiment, in the first surface 31 of the dielectric substrate 30, an area in the side of the second end 72 with respect to the first reference location 81 serving as a reference is a flat surface parallel to the X direction. On the other hand, in the first surface 31 of the dielectric substrate 30, an area in the side of the first end 71 with respect to the first reference location 81 (first specific area 91) is a surface inclined in the X direction. However, the first specific area 91 may be a flat surface parallel to the X direction as long as the electric field intensity can be increased toward the first end 71.

Similarly, in the plasma generator 1 of the present embodiment, in the second surface 32 of the dielectric substrate 30, an area in the side of the second end 72 with respect to the second reference location 82 serving as a reference is a flat surface parallel to the X direction, while an area in the side of the first end 71 with respect to the second reference location 82 (second specific area 92) is a flat surface parallel to the X direction or a surface inclined in the X direction.

Figure 6A:
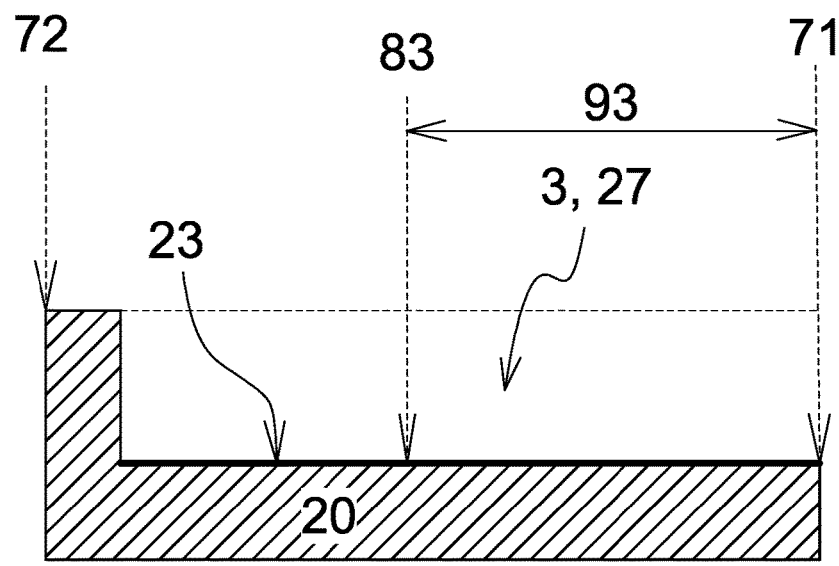
FIG. 6A is an enlarged cross-sectional view obtained by extracting the second electrode 20 from FIG. 2.
Figure 6A:
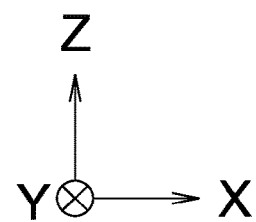

FIG. 6A is an enlarged view obtained by extracting only the second electrode 20 from the drawing illustrated in FIG. 2. As described above, the second electrode 20 has a surface constituting the bottom surface of the recess 27. Hereinafter, for the convenience of description, this surface is referred to as a "third surface 23".

Figure 6B:
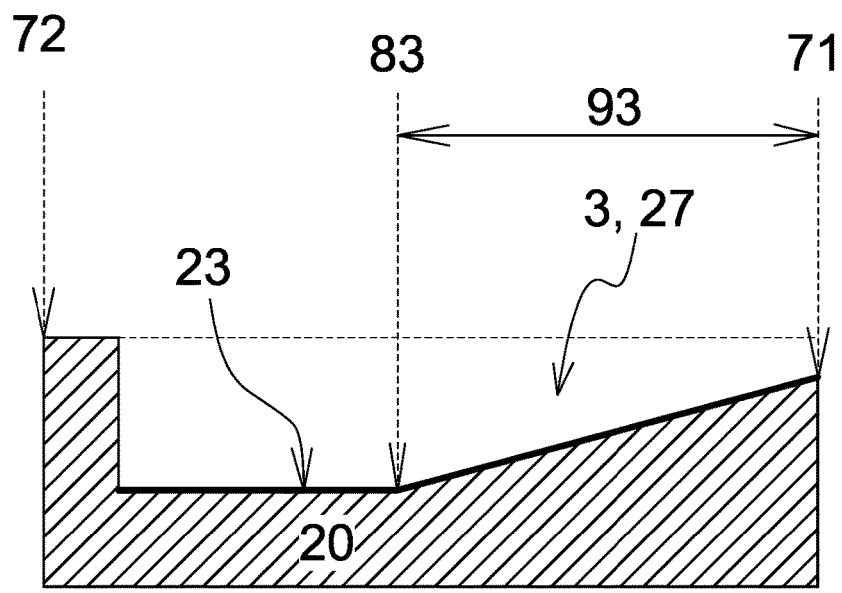
FIG. 6B is a cross-sectional view illustrating another configuration example of the second electrode 20 in the same manner as FIG. 6A.
Figure 6B:
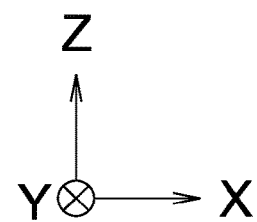

In the example illustrated in FIG. 6A, the third surface 23 is a flat surface parallel to the X direction regardless of the position of the X coordinate. However, in the present embodiment, it is not excluded that the third surface 23 has a surface (inclined surface) inclined in the X direction. For example, in the example illustrated in FIG. 6B, in the third surface 23, an area from the second end 72 to a predetermined location (referred to as a "third reference location 83") in the X direction is a flat surface parallel to the X direction, and an area from the third reference location 83 to the first end 71 (referred to as a "third specific area 93") is a surface inclined in the X direction.

That is, in the plasma generator 1 of the present embodiment, in the third surface 23, an area in the side of the second end 72 with respect to the third reference location 83 serving as a reference is a flat surface parallel to the X direction, and an area in the side of the first end 71 with respect to the third reference location 83 (third specific area 93) is a flat surface parallel to the X direction or a surface inclined in the X direction.

The degree of inclination of the first surface 31, the second surface 32, and the third surface 23 is set such that the electric field intensity increases toward the +X side in the gas flow path 3 near the outlet 5. This relationship will be described later with reference to FIG. 8.

Figure 7:
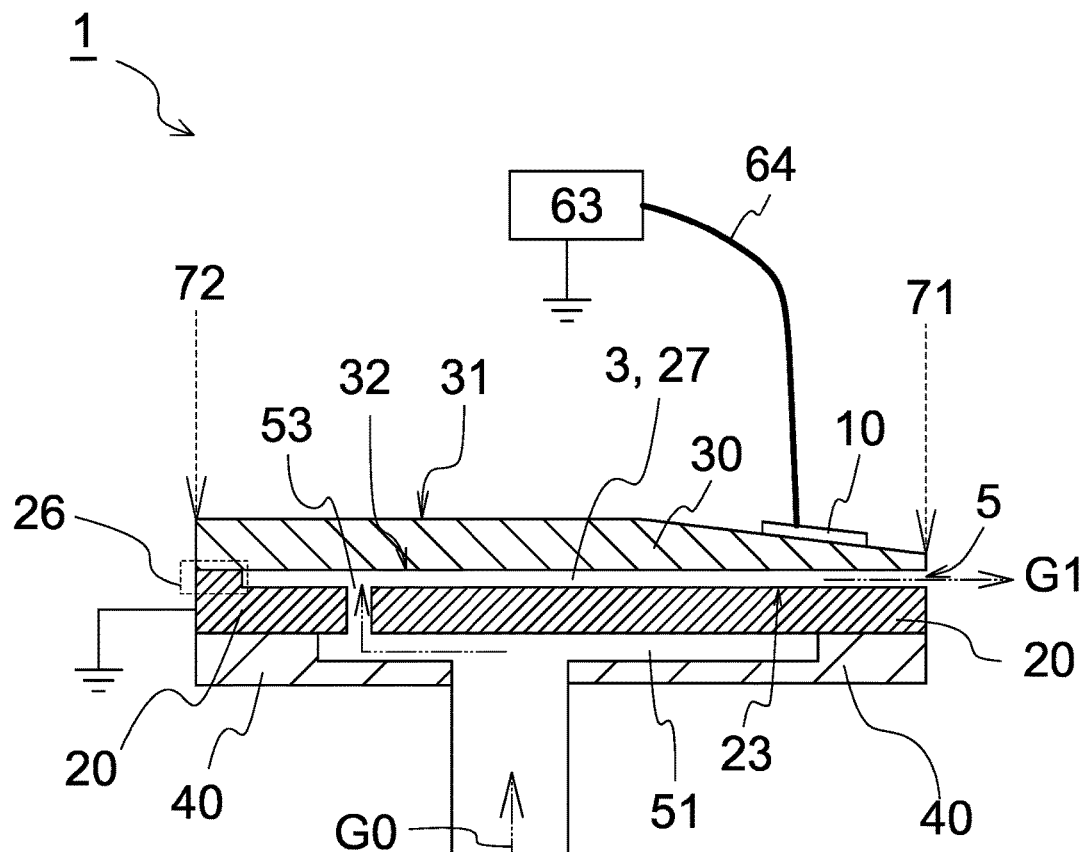
FIG. 7 is a schematic cross-sectional view illustrating a modification of the plasma generator according to FIG. 2.

Meanwhile, the first electrode 10 may be disposed only near the first end 71 in the X direction (cf. FIG. 7). When a high voltage is applied to a location near the outlet 5, a high electric field is applied to the gas flowing through the gas flow path 3 at the location, and the gas is turned into plasma.

Figure 8:
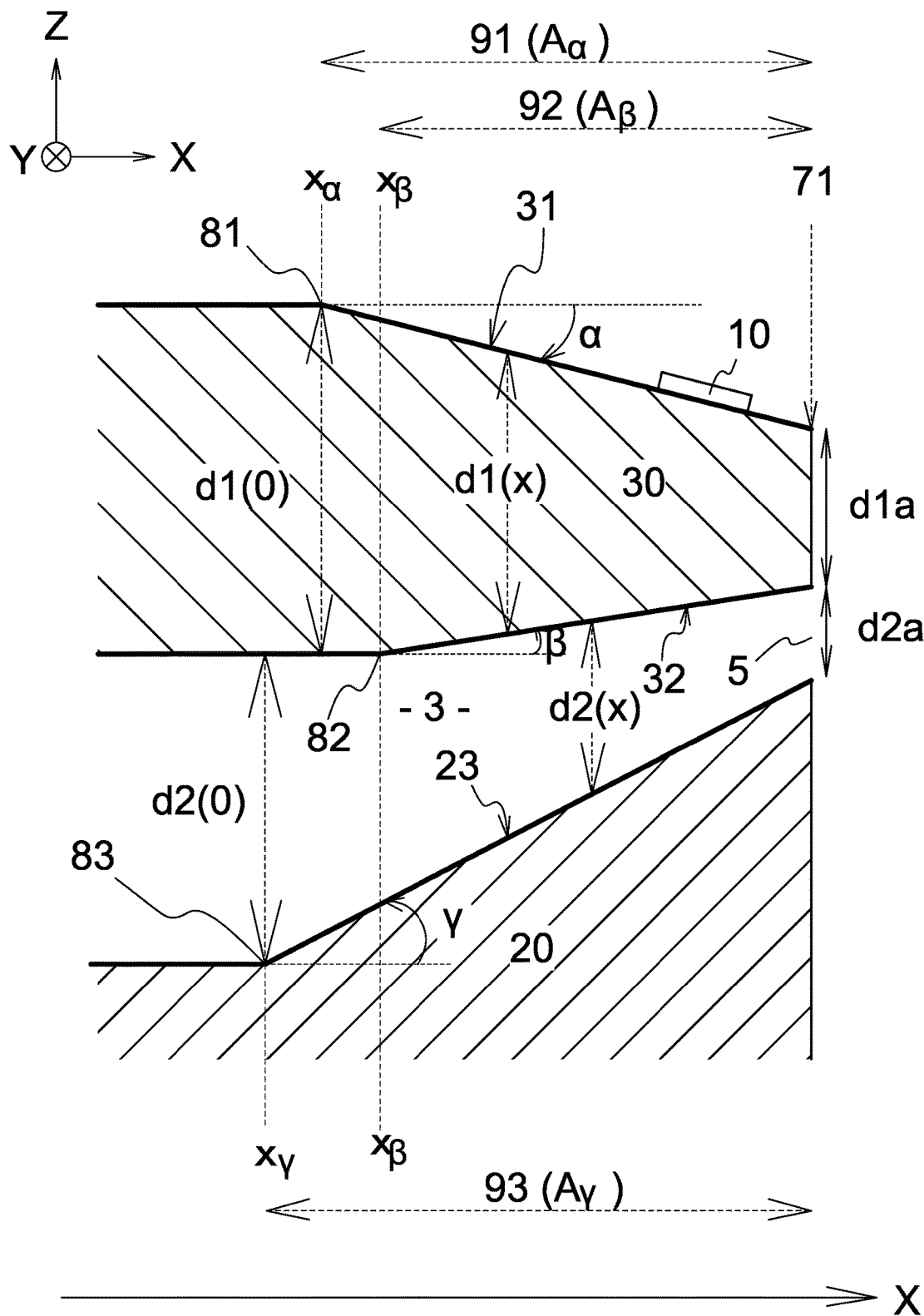
FIG. 8 is a schematic view for explaining shapes of a first surface 31, a second surface 32, and a third surface 23.

FIG. 8 is a schematic view for explaining the shapes of the first surface 31, the second surface 32, and the third surface 23. For ease of understanding, some structures are shown with exaggeration.

Here, the first surface 31 is assumed to be an inclined surface on the +X side (first end 71 side) from the first reference location 81, and the inclination angle is $\alpha$. In the present specification, the "inclination angle" is defined by an angle in a line parallel to the X direction when the target surface is viewed in the Y direction, and an angle formed counterclockwise is defined as a positive angle. The inclination angle may be defined as an angle of the target surface in the XY plane. The same applies to the second surface 32 and the third surface 23 to be described below.

In FIG. 8, the X coordinate at the first reference location 81 is $x_\alpha$. Note that $\alpha$ may be 0°. In this case, the first surface 31 is a flat surface regardless of the X coordinate.

It is assumed that the +X side (first end 71 side) of the second surface 32 from the second reference location 82 is an inclined surface, and the inclination angle is $\beta$. In FIG. 8, the X coordinate at the second reference location 82 is $x_\beta$. Note that $\beta$ may be 0°. In this case, the second surface 32 is a flat surface regardless of the X coordinate.

It is assumed that the +X side (first end 71 side) of the third surface 23 from the third reference location 83 is an inclined surface, and the inclination angle is $\gamma$. In FIG. 8, the X coordinate at the third reference location 83 is $x_\gamma$. Note that $\gamma$ may be 0°. In this case, the third surface 23 is a flat surface regardless of the X coordinate.

An electric field at a certain X coordinate value x is $E(x)$, the thickness of the dielectric substrate 30 is $d1(x)$, and the height of the gas flow path 3 is $d2(x)$. The relative permittivity of the dielectric substrate 30 is $\varepsilon_r$, and the relative permittivity of the gas flowing through the gas flow path 3 is $\varepsilon_0$, and then, the electric field $E(x)$ is defined by the following Formula (3).

[Math 2]

$$E(x) = \frac{\varepsilon_0 V}{\varepsilon_r \ d_1(x) + \varepsilon_0 \ d_2(x)} \quad (3)$$

Here, the location where the thickness of the dielectric substrate 30 starts to change toward the +X direction is a location on the −X side (the side close to the second end 72), which is one of the first reference location 81 or the second reference location 82. The example of FIG. 8 corresponds to the first reference location 81. The thickness of the dielectric substrate 30 at the location where the thickness of the dielectric substrate 30 starts to change is defined as $d1(0)$.

Similarly, the location where the height of the gas flow path 3 starts to change toward the +X direction is a position on the −X side (side close to the second end 72), which is one of the second reference location 82 or the third reference location 83. The example of FIG. 8 corresponds to the third reference location 83. The height of the gas flow path 3 at a location where the height of the gas flow path 3 starts to change is defined as $d2(0)$.

According to the above definition and FIG. 8, by plane geometry, the thickness $d1(x)$ of the dielectric substrate 30 and the height $d2(x)$ of the gas flow path 3 at the position where the X coordinate is x are expressed by the following formulas (4) and (5), respectively.

[Math 3]

$$d_1(x) = (x - x_\alpha) \sin \alpha - (x - x_\beta) \sin \beta + d_1(0) \quad (4)$$

$$d_2(x) = (x - x_\beta) \sin \beta - (x - x_\gamma) \sin \gamma + d_2(0) \quad (5)$$

Substituting Formulas (4) and (5) into the above Formula (3) gives the following Formula (6).

[Math 4]

$$E(x) = \frac{\varepsilon_0 V}{e_r\{(x - x_\alpha) \sin \alpha - (x - x_\beta) \sin \beta + d_1(0)\} + \varepsilon_0\{(x - x_\beta) \sin \beta - (x - x_\gamma) \sin \gamma + d_2(0)\}} \quad (6)$$

Here, in Formula (6), the numerator is a constant. Thus, in Formula (6), to monotonically increase the electric field $E(x)$ at the position where the X coordinate is x, the denominator in the above Formula need only monotonically decrease, in other words, the differential value of the denominator need only be less than 0. As a result, Formula (1) described above is derived. Formula (1) is described again below.

[Math 5]

$$\sin \alpha + (\varepsilon_r - 1) \sin \beta - \varepsilon_r \sin \gamma < 0 \quad (1)$$

Meanwhile, the thickness $d1(x)$ of the dielectric substrate 30 and the height $d2(x)$ of the gas flow path 3 at the position where the X coordinate is x also need to be positive values at the position of the first end 71. Therefore, when the length in the X direction of the area from the first reference location 81 to the first end 71 (first specific area 91) is denoted by $A_\alpha$, the length in the X direction of the area from the second reference location 82 to the first end 71 (second specific area 92) is denoted by $A_\beta$, and the length in the X direction of the area from the third reference location 83 to the first end 71 (third specific area 93) is denoted by $A_\gamma$, the Formula (2) described above is derived from the relationship of plane geometry so that the thickness $d1(x)$ of the dielectric substrate 30 and the height $d2(x)$ of the gas flow path 3 at the position of the first end 71 are positive. Formula (2) is described again below.

[Math 6]

$$A_\alpha \sin \alpha + d1(0) > A_\beta \sin \beta > A_\gamma \sin \gamma - d2(0) \quad (2)$$

That is, by shaping the surfaces (first surface 31, second surface 32) of the dielectric substrate 30 and the surface (third surface 23) of the second electrode 20 to satisfy the Formulas (1) and (2) described above, the electric field intensity of the gas flowing through the gas flow path 3 toward the outlet 5 monotonically increases. As a result, an extremely high electric field intensity is achieved near the outlet 5, enabling generation of plasma with high efficiency.

The size of the plasma generator 1 is not particularly limited. In addition, the dielectric substrate 30 and the second electrode 20 are configured to satisfy the above Formulas (1) and (2).

As an example, the external dimensions are 750 mm in width (the length in the Y direction), 40 mm in length (the length in the X direction), and 20 mm in thickness (the length in Z direction at the thickest location).

The outer dimensions of the dielectric substrate 30 are 750 mm in width, 40 mm in length, and 0.1 mm in thickness ($d1a$) at the first end 71.

The outer dimensions of the second electrode 20 are 750 mm in width, 20 mm in length, and 0.1 mm in thickness at the first end 71.

The outer dimensions of the gas flow path 3 are 700 mm in width and 35 mm in length.

The outlet 5 has an opening width of 700 mm and an opening height of 0.2 mm.

EXAMPLES

A plasma generator 1 having the structure illustrated in FIGS. 1 to 3, with the surfaces (first surface 31, second surface 32) of the dielectric substrate 30 and the surface (third surface 23) of the second electrode 20 in shapes satisfying Formulas (1) and (2), and with the above dimensions adopted, was used as Example 1. Note that the material of the dielectric substrate 30 was aluminum oxide, and the main material of each of the first electrode 10 and the second electrode 20 was copper.

Figure 9A:
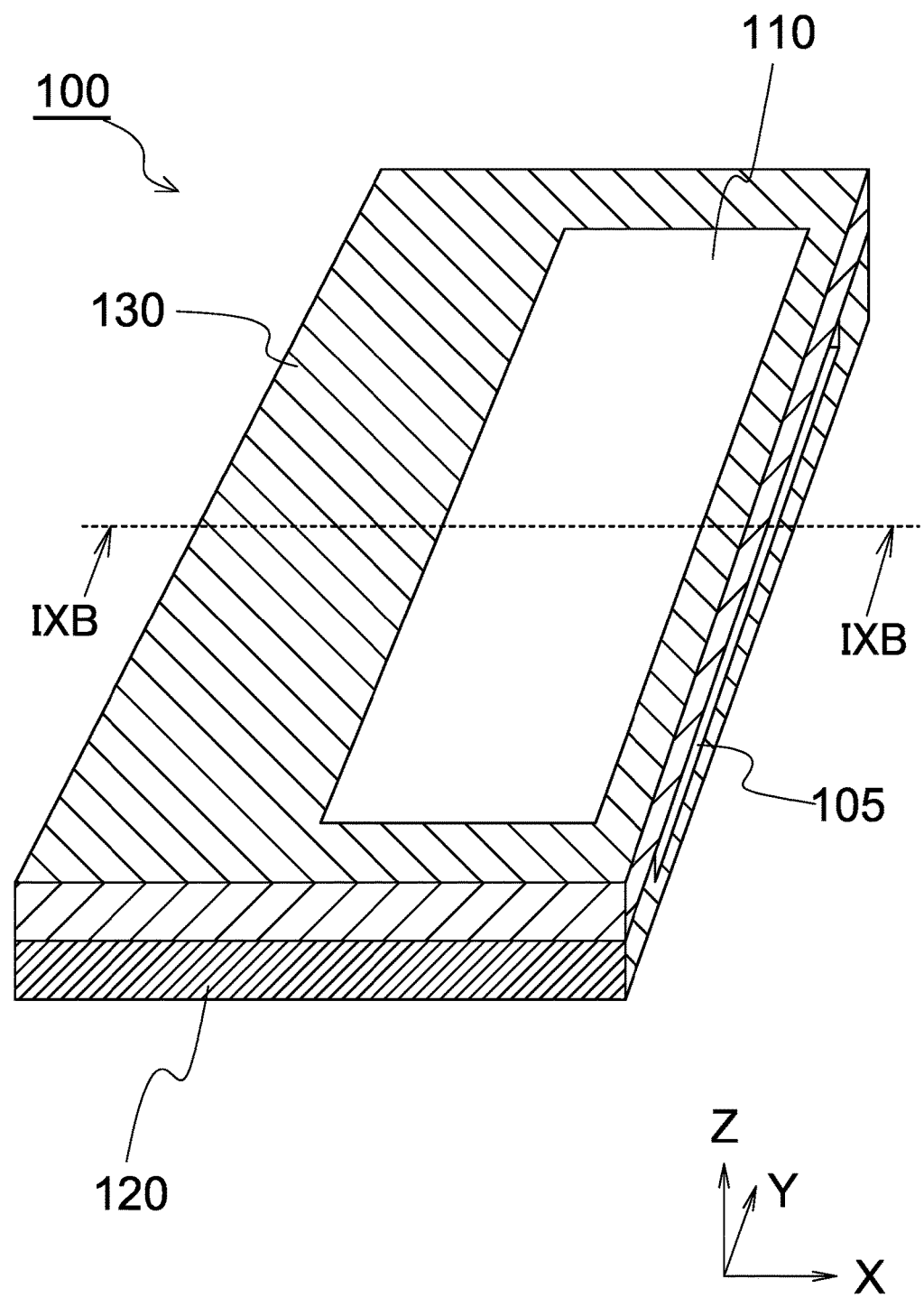
FIG. 9A is a perspective view schematically illustrating a configuration of a plasma generator of Comparative Example 1.
Figure 9B:
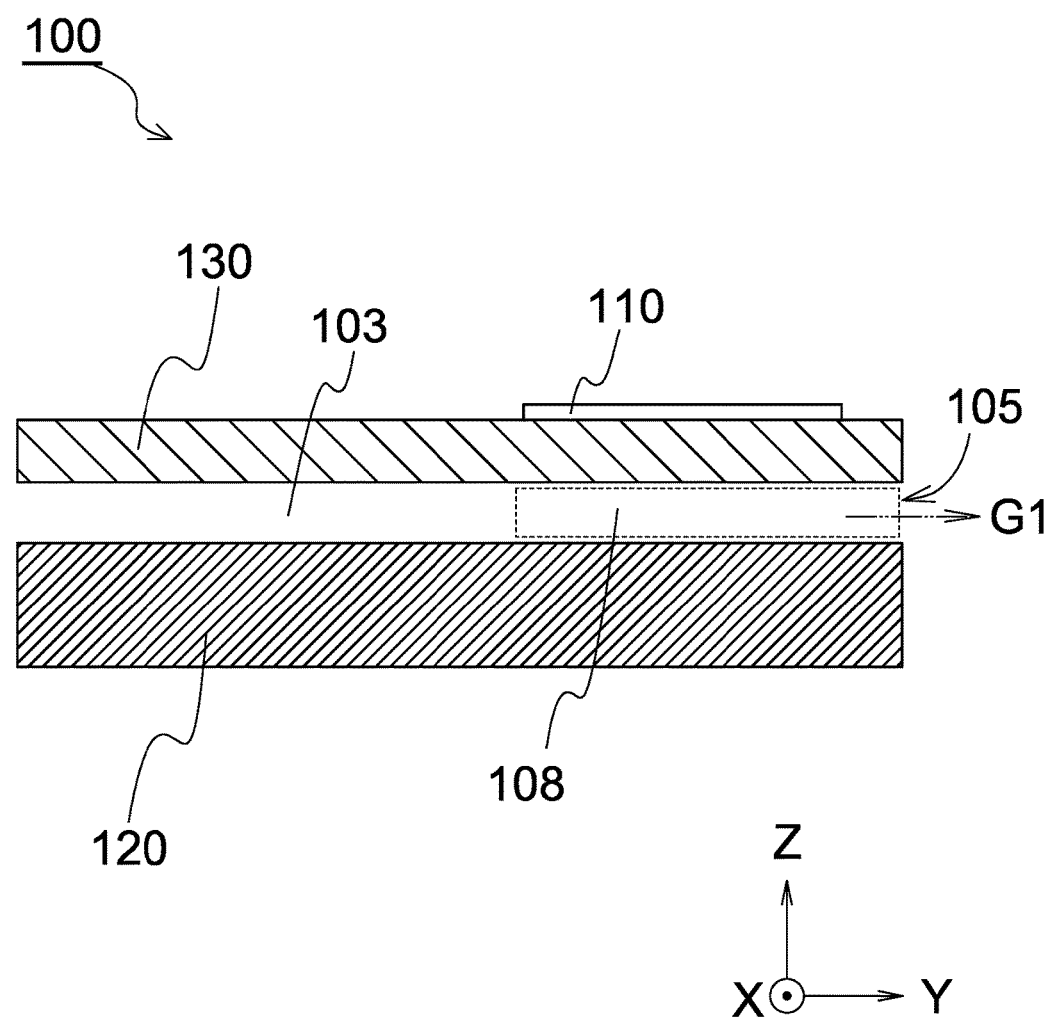
FIG. 9B is a schematic cross-sectional view of the plasma generator illustrated in FIG. 9A taken along line IXB-IXB.

A plasma generator 100 having a structure schematically illustrated in FIGS. 9A and 9B was designated as Comparative Example 1. In FIGS. 9A to 9B, the illustration of the gas buffer substrate is omitted. FIG. 9B is a cross-sectional view taken along line IXB-IXB in FIG. 9A.

That is, the plasma generator 100 of Comparative Example 1 includes a first electrode 110, a second electrode 120, and a dielectric substrate 130, and a pair of main surfaces of the dielectric substrate 130 and the surface of the second electrode 120 on the dielectric substrate 130 side are all flat surfaces. Therefore, although Formula (2) is satisfied, Formula (1) is not satisfied.

In the plasma generator 100 of Comparative Example 1 as well, the gas flowing in a gas flow path 103 formed between the second electrode 120 and the dielectric substrate 130 is turned into plasma when passing through a high electric field area 108, and is ejected as a plasma gas G1 from an outlet 105.

Both the plasma generator 1 of Example 1 and the plasma generator 100 of Comparative Example 1 were operated under the following conditions. A polypropylene substrate as an object to be treated was allowed to pass through a position 2 mm away from the outlet (5, 105) at 10 mm/sec, and then the water contact angle of the surface of the substrate was measured using a contact angle meter (DMs-401 manufactured by Kyowa Interface Science Co., Ltd.)
(Operating Conditions)
Applied voltage: 7.6 kVpp, frequency 38 kHz
Gas type: Nitrogen
Gas flow rate: 300 L/min
The results are shown in Table 1.

TABLE 1

| | Water contact angle [°] |
|---|---|
| Example 1 | 60 ± 2 |
| Comparative Example 1 | 70 ± 3 |

It can be seen from Table 1 that Example 1 has a smaller water contact angle and has been more hydrophilic than Comparative Example 1. Moreover, it can be seen that Example 1 has inhibited the variation in the water contact angle more and has been able to treat the substrate more uniformly than Comparative Example 1.

Figure 10:
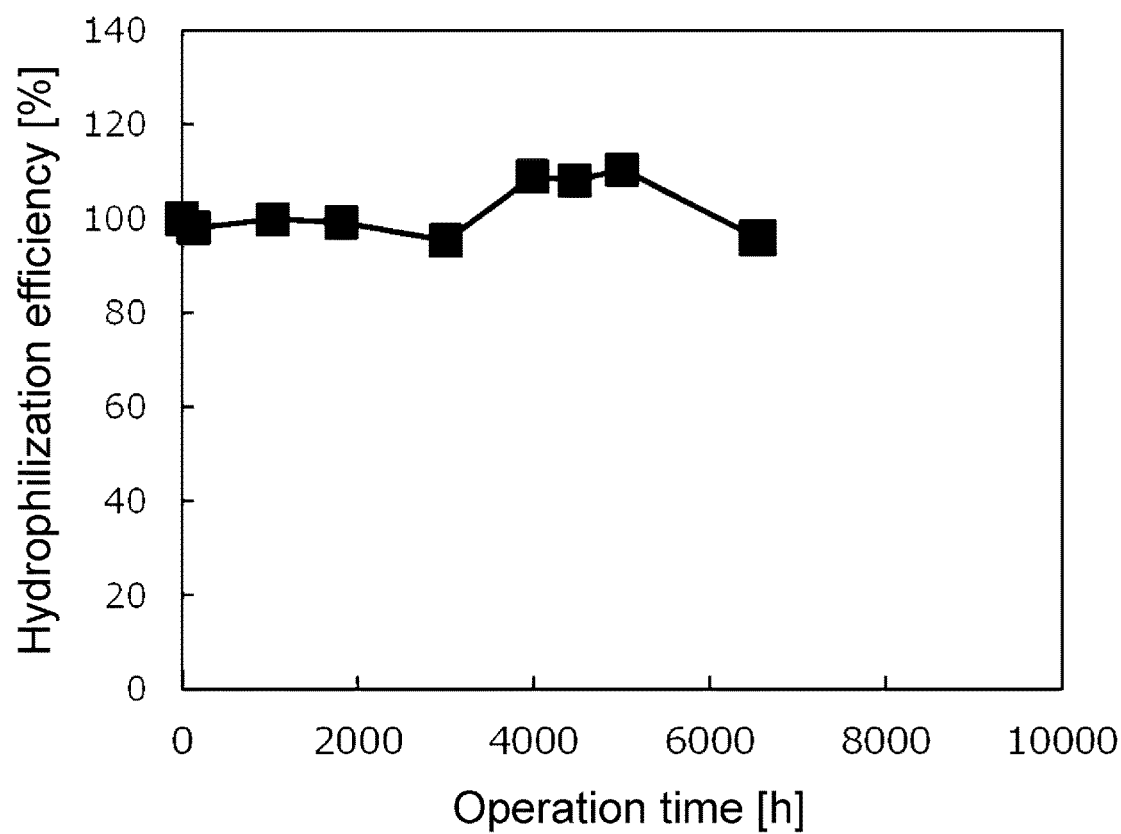
FIG. 10 is a graph illustrating a change in hydrophilization efficiency when the plasma generator 1 of Example 1 is continuously operated.

Next, FIG. 10 illustrates a change in hydrophilization efficiency when the plasma generator 1 of Example 1 is continuously operated. The hydrophilization efficiency is an index indicating the rate of temporal change in a difference value ($\Delta\theta(t)$) between the water contact angle before treatment and the water contact angle after treatment. More specifically, the hydrophilization efficiency is an index indicated by the ratio of the difference value $\Delta\theta(t)$ at operation time t, with a difference value $\Delta\theta(0)$ immediately after the start of operation (t=0 for convenience) as a reference. That is, the fact that the ratio is close to 100% indicates that the same treatment capacity as that at the start of operation has been achieved.

It can be seen from FIG. 10 that in the case of the plasma generator 1 of Example 1, no damage to the dielectric substrate 30 and the electrode (10, 20) is observed even after continuous operation for 6000 hours or more, and the initial performance is maintained.

In contrast, when the plasma generator 100 of Comparative Example 1 was continuously operated, damage started to occur after more than an hour had passed. Therefore, the plasma generator 100 of Comparative Example 1 is unsuitable for continuous operation for more than one hour.

Figure 11:
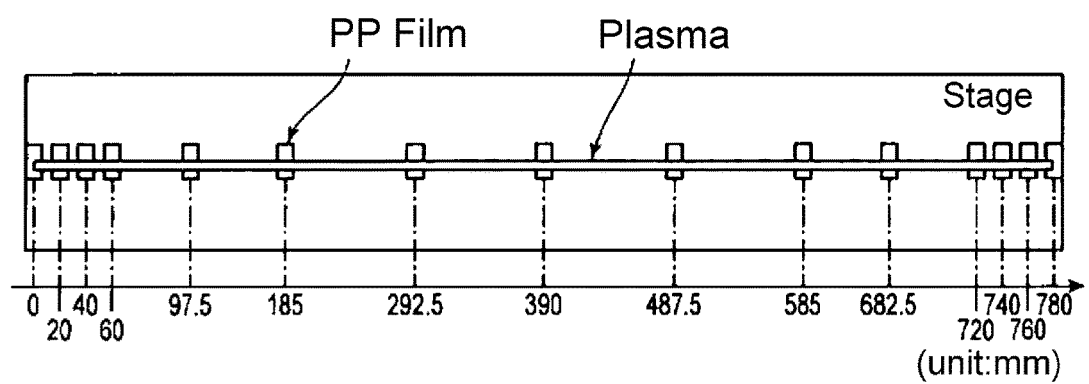
FIG. 11 is a plan view illustrating a state in which polypropylene (PP) films as an object to be exposed is disposed on a stage at predetermined intervals.
Figure 11:
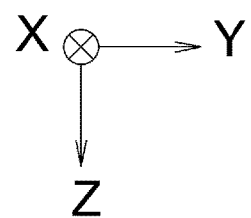

FIG. 11 is a plan view illustrating a state in which a polypropylene (PP) film as objects to be treated are disposed on a stage at predetermined intervals. As illustrated in FIG. 11, the polypropylene (PP) films were disposed as objects to be exposed at predetermined intervals on the stage, and the plasma gas G1 was applied from above using the plasma generator 1 according to Example 1. More specifically, the PP film was fixed on a uniaxial stage at a position 2 mm (exposure distance) from the outlet 5, the outlet 5 was reciprocated at 100 mm/sec, and exposure to the plasma gas G1 was performed. The water contact angle of each PP film surface was measured at the timing when the plasma gas G1 had been exposed 2 times (after 2 reciprocating motions), 10 times (after 10 reciprocating motions), and 200 times (after 200 reciprocating motions).

The water contact angle was measured under the following conditions.
  Contact angle meter: DMs-401 (manufactured by Kyowa Interface Science Co., Ltd.)
  Liquid amount: 2 µL
  Approximation is performed using elliptical fitting.

Figure 12:
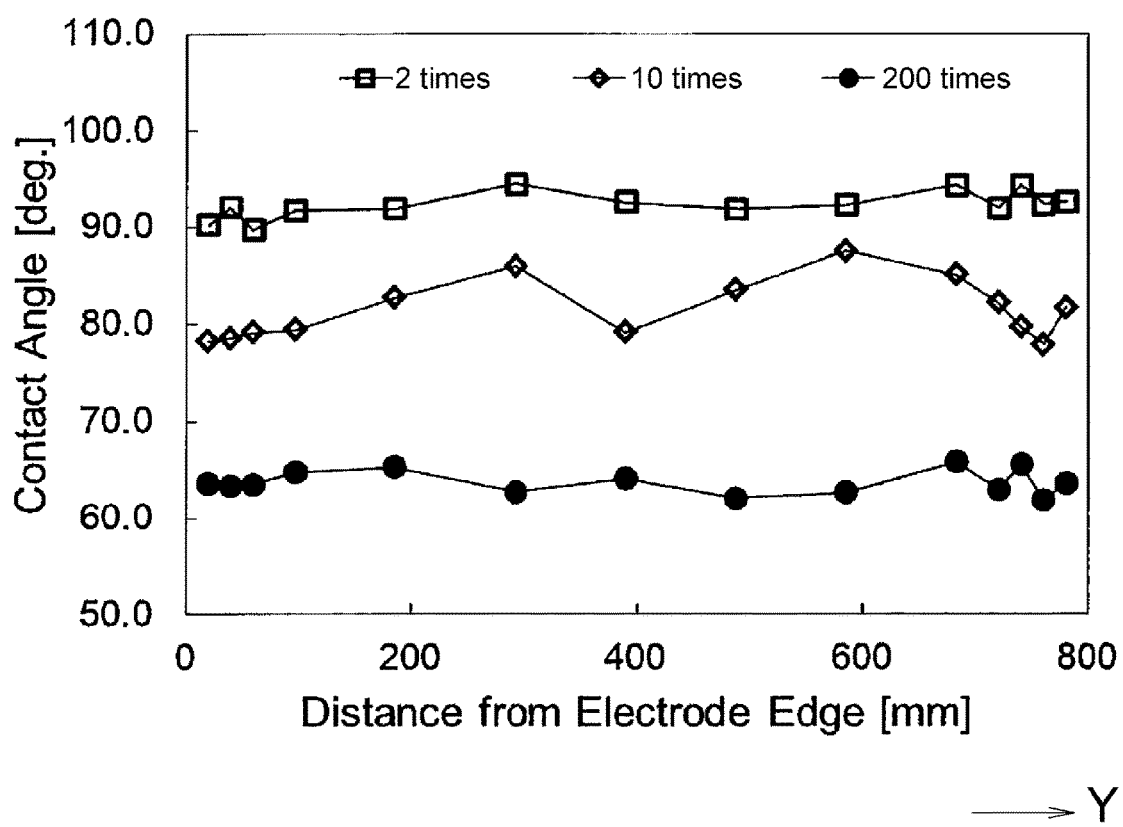
FIG. 12 is a graph illustrating measurement results of a water contact angle.

FIG. 12 is a graph illustrating the measurement results of the water contact angle. As can be seen from FIG. 12, the water contact angle was within ±10% from the average value in the width direction (Y direction) under any exposure condition. When polypropylene (PP) films were disposed at locations of 10 mm, 30 mm, and 50 mm in the Y coordinate and a similar test was performed, the average value was within ±10% of the average value illustrated in FIG. 12. It can be seen from the above results that according to the plasma generator 1 of Example 1, the plasma gas G1 is uniformly ejected from the entire area of the outlet 5 in the Y direction.

Figure 13:
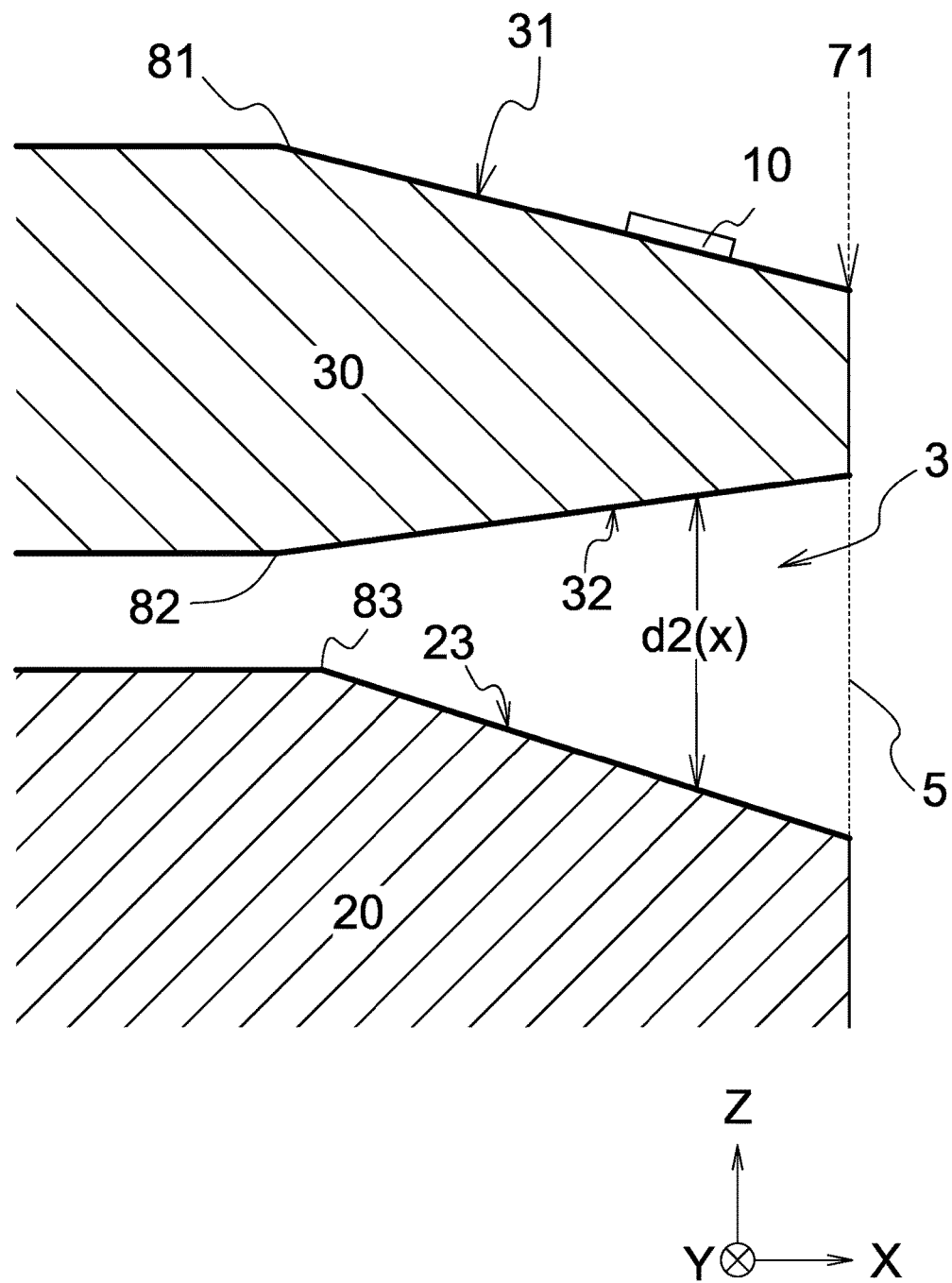
FIG. 13 is a partially enlarged cross-sectional view schematically illustrating another configuration of one embodiment of the dielectric barrier discharge plasma generator.

In the plasma generator 1, as long as the surface (first surface 31, second surface 32) of the dielectric substrate 30 and the surface (third surface 23) of the second electrode 20 have shapes that satisfy the Formulas (1) and (2), the directions of the inclinations of these surfaces are not restricted. For example, as illustrated in FIG. 13, the first surface 31 may be inclined to the −Z side in the X direction, the second surface 32 may be inclined to the +Z side in the X direction, and the third surface 23 may be inclined to the −Z side in the X direction. In this case, the height $d2(x)$ of the gas flow path 3 increases toward the first end 71 (outlet 5).

Figure 14:
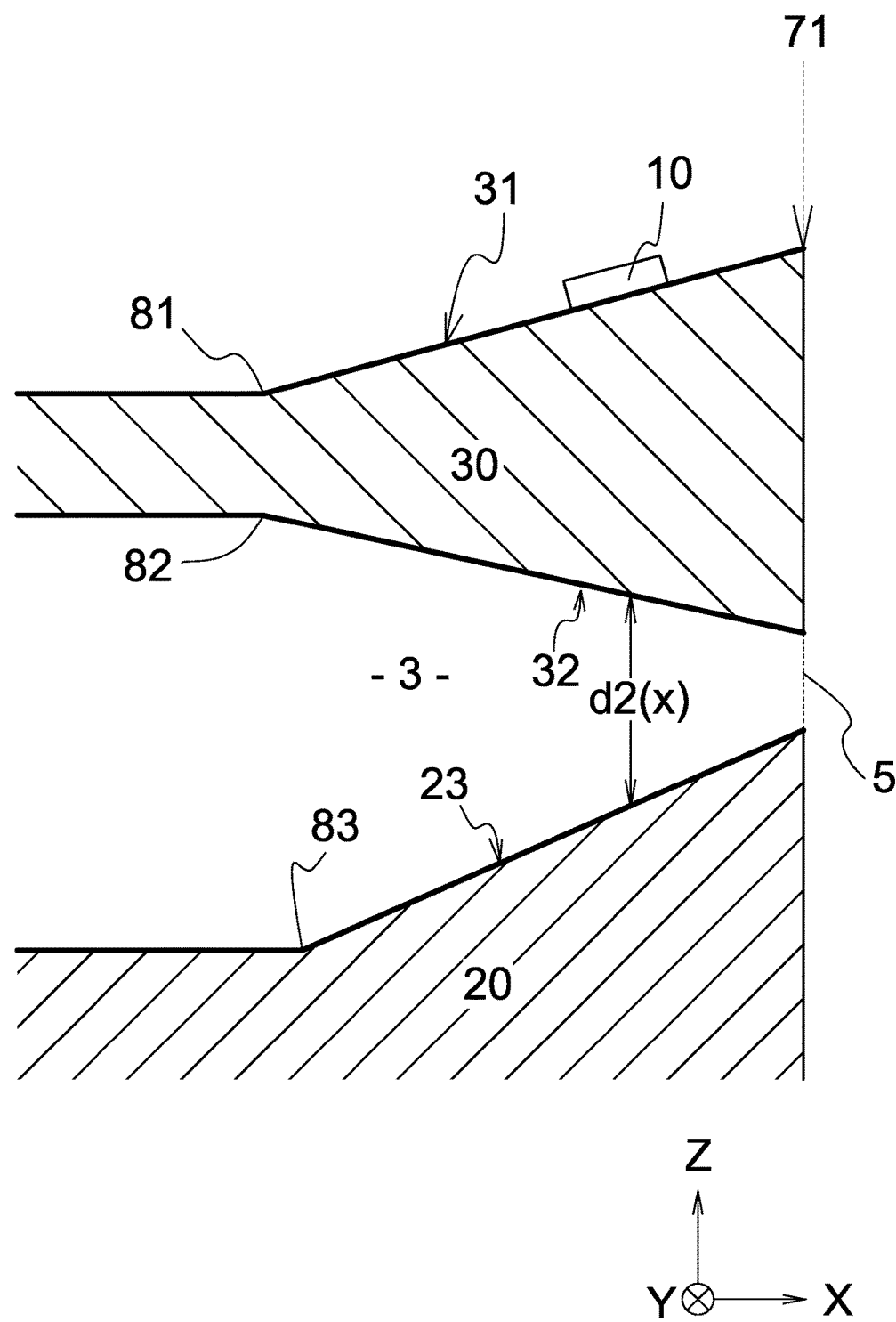
FIG. 14 is a partially enlarged cross-sectional view schematically illustrating another configuration of one embodiment of the dielectric barrier discharge plasma generator.

As illustrated in FIG. 14, the first surface 31 may be inclined to the +Z side in the X direction, the second surface 32 may be inclined to the −Z side in the X direction, and the third surface 23 may be inclined to the +Z side in the X direction. In this case, the height $d2(x)$ of the gas flow path 3 decreases toward the first end 71 (outlet 5).

Figure 15:
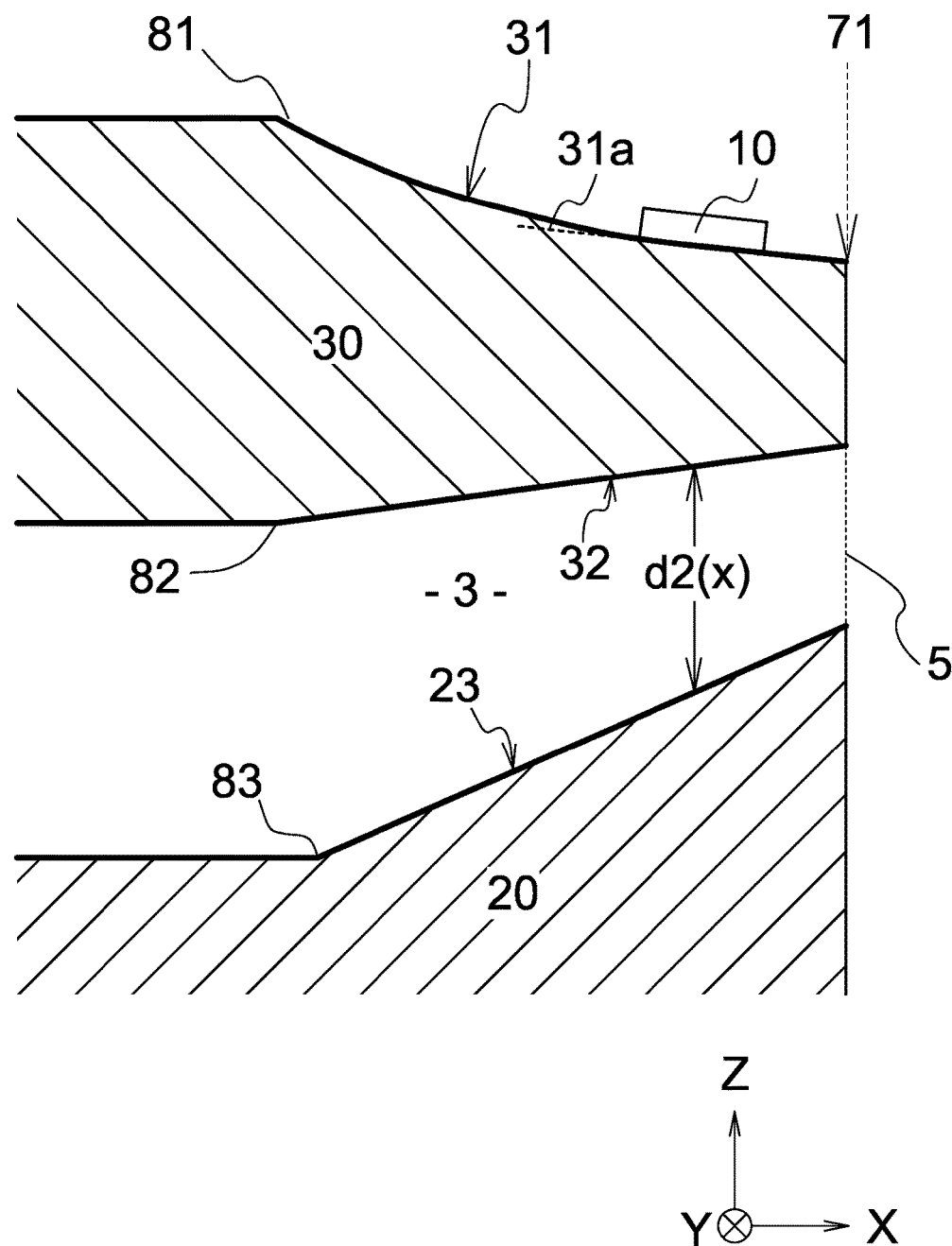
FIG. 15 is a partially enlarged cross-sectional view schematically illustrating another configuration of one embodiment of the dielectric barrier discharge plasma generator.

As illustrated in FIG. 15, the first surface 31 may be a curved surface. In this case, a minute area can be regarded as a flat surface, and hence a plane 31a, which approximates the first surface 31, need only satisfy Formulas (1) and (2). The same applies to the second surface 32 and the third surface 23.

Figure 16:
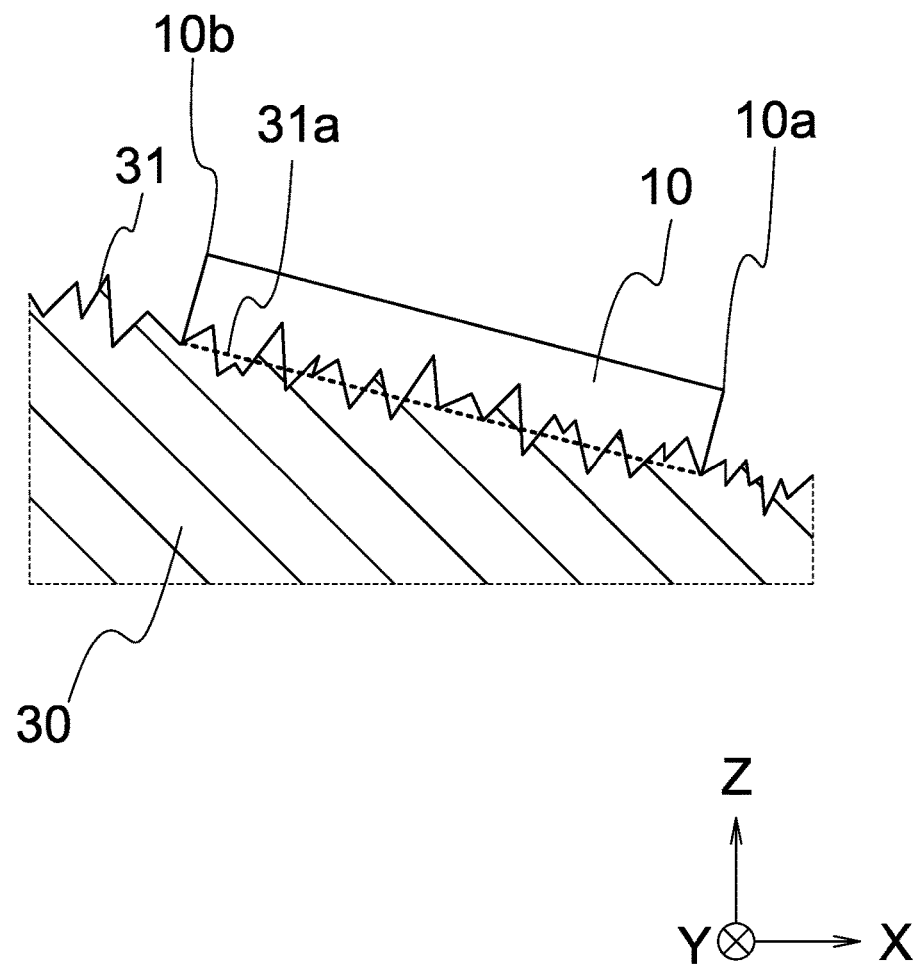
FIG. 16 is a partially enlarged cross-sectional view schematically illustrating another configuration of one embodiment of the dielectric barrier discharge plasma generator.

As illustrated in FIG. 16, irregularities may be formed on a part of the first surface 31. As described above, from the viewpoint of improving adhesion with the first electrode 10, a method of providing irregularities on the first surface 31 can be adopted. In this case, Formulas (1) and (2) need only be satisfied using the plane 31a that connects the contact locations between the end portion (10a, 10b) of the first electrode 10 in the X direction and the dielectric substrate 30.

Modifications

The plasma generator 1 can adopt various variations as illustrated in FIGS. 17A to 17G as long as the surfaces (first surface 31, second surface 32) of the dielectric substrate 30 and the surface (third surface 23) of the second electrode 20 have shapes that satisfy Formulas (1) and (2). FIGS. 17A to 17G are schematic cross-sectional views of modifications of the plasma generator 1, illustrated with excerpts of only some elements. In the following FIGS. 17A to 17G as well, some parts may be illustrated with exaggeration for the convenience of description.

In the following description of the modifications, only locations different from the embodiment described above will be described.

Figure 17A:
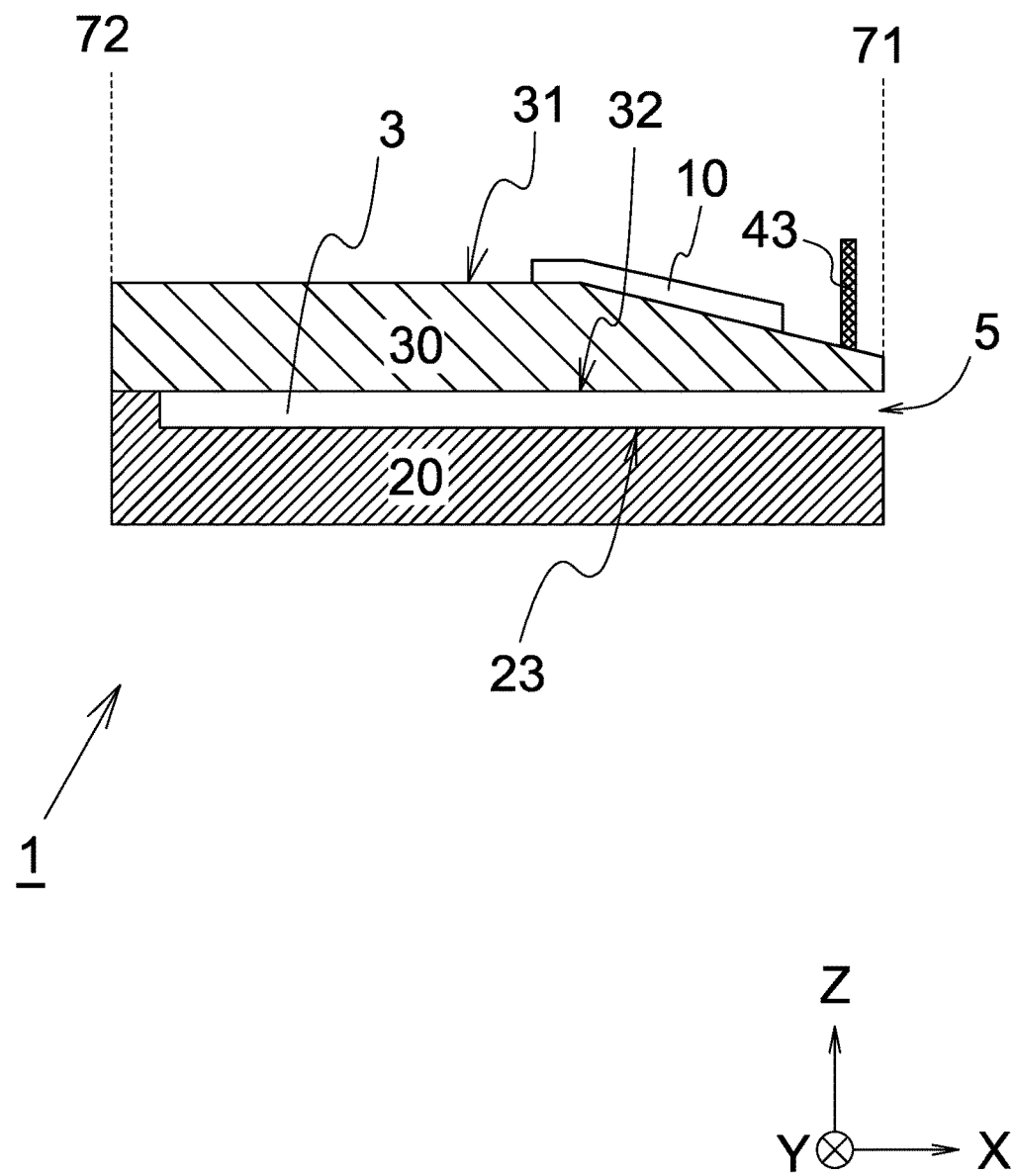
FIG. 17A is a partially enlarged cross-sectional view schematically illustrating another configuration of one embodiment of the dielectric barrier discharge plasma generator.

<1>The plasma generator 1 of the modification illustrated in FIG. 17A includes a protrusion 43 between the first electrode 10 and the first end 71 in the X direction, that is, between the first electrode 10 and the outlet 5, on the first surface 31 of the dielectric substrate 30. The protrusion 43 can be made of the material exemplified as the material of the dielectric substrate 30. The protrusion 43 may be integrally formed on the dielectric substrate 30 or may be attached thereto as a separate member.

By providing the protrusion 43 between the first electrode 10 and the outlet 5 in the X direction, a creepage distance between the first electrode 10 and the second electrode 20 on the outlet 5 side is ensured. This inhibits unnecessary discharge such as a short circuit between the first electrode 10 and the second electrode 20 and the occurrence of creeping discharge.

Figure 17B:
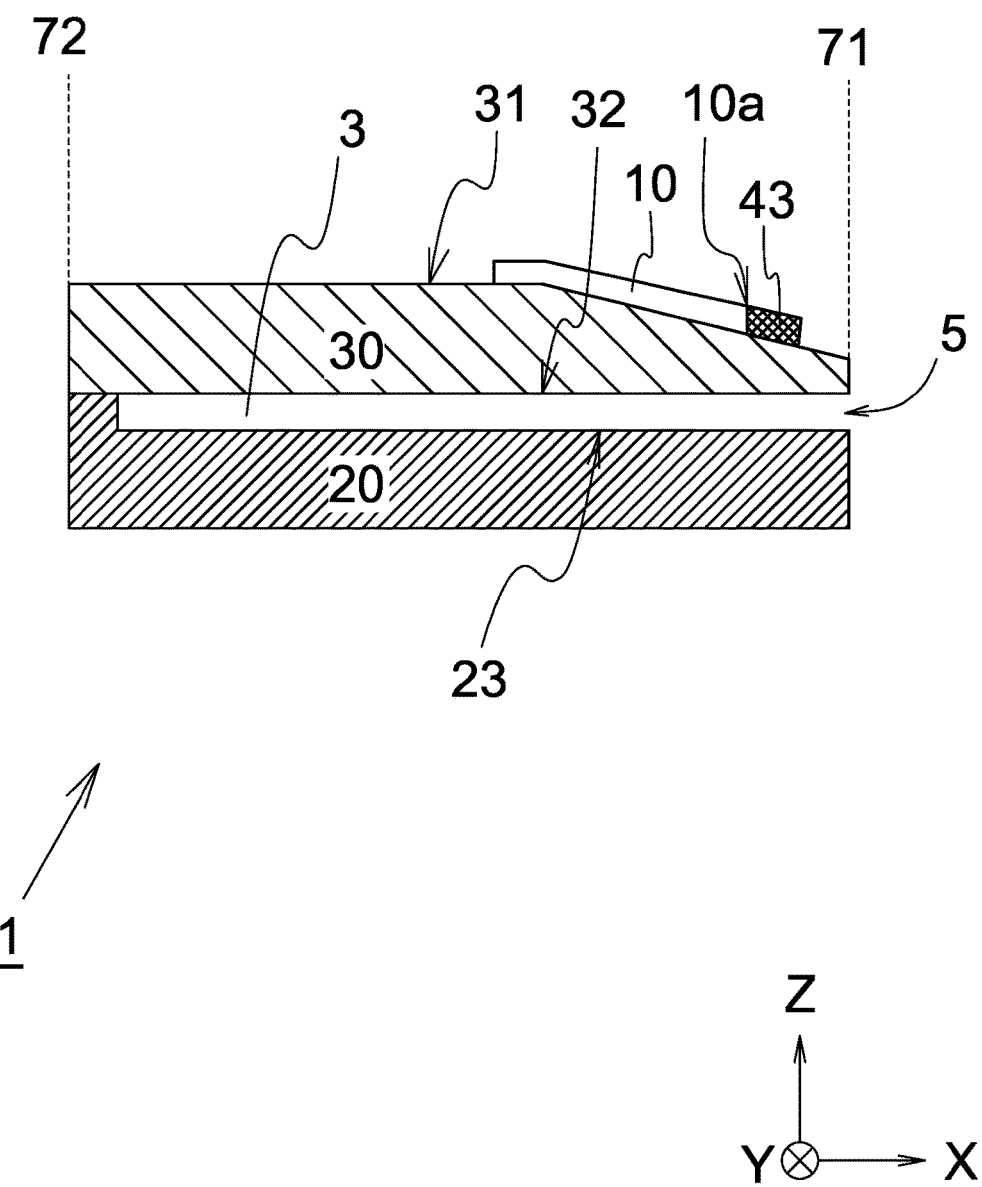
FIG. 17B is a partially enlarged cross-sectional view schematically illustrating another configuration of one embodiment of the dielectric barrier discharge plasma generator.

From a similar viewpoint, as illustrated in FIG. 17B, the protrusion 43 may be formed to be in contact with the +X-side end portion 10a of the first electrode 10.

Figure 17C:
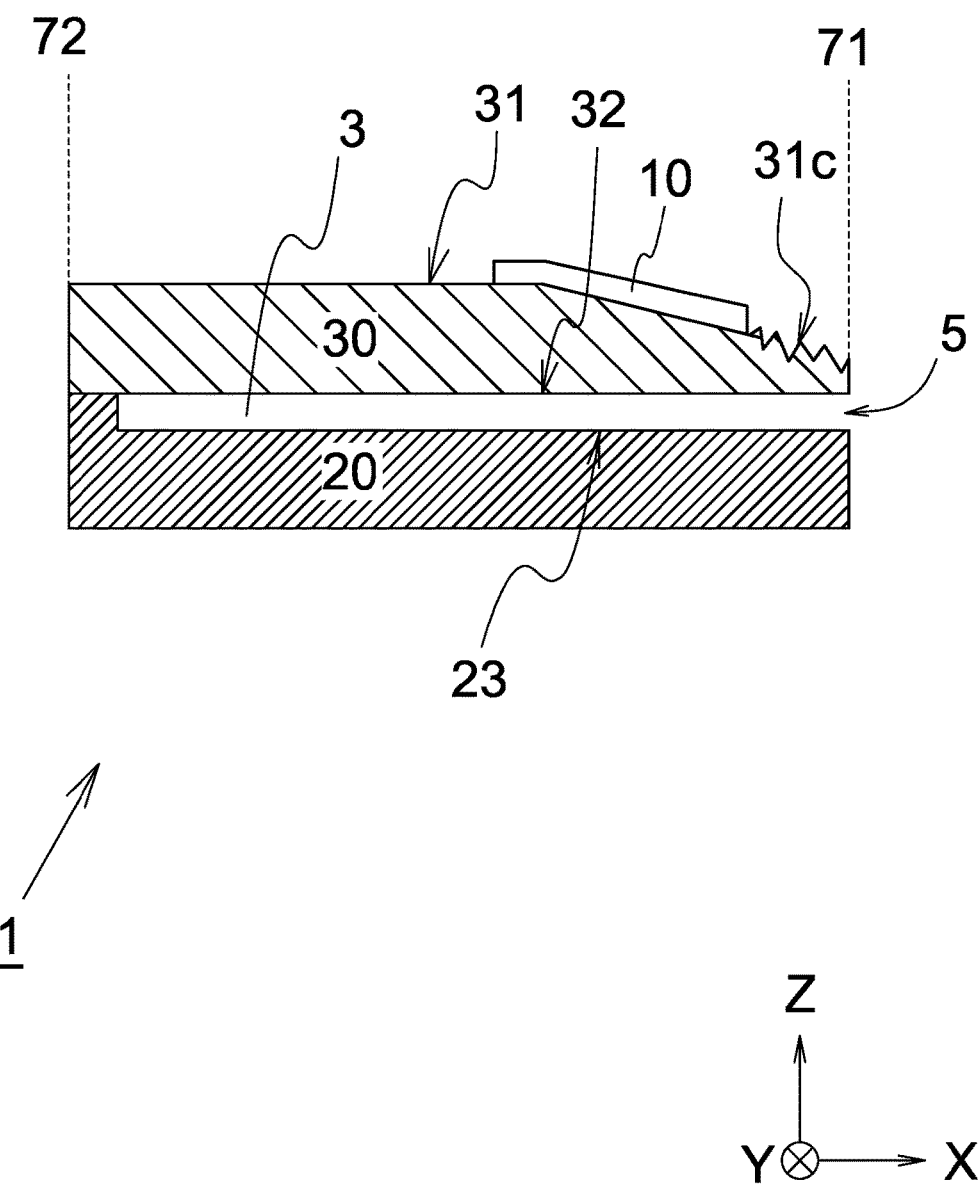
FIG. 17C is a partially enlarged cross-sectional view schematically illustrating another configuration of one embodiment of the dielectric barrier discharge plasma generator.

<2>The plasma generator 1 of the modification illustrated in FIG. 17C includes an uneven portion 31c between the first electrode 10 and the first end 71, that is, between the first electrode 10 and the outlet 5 in the X direction on the first surface 31 of the dielectric substrate 30. Such a configuration also ensures a creepage distance between the first electrode 10 and the second electrode 20 on the outlet 5 side.

Figure 17D:
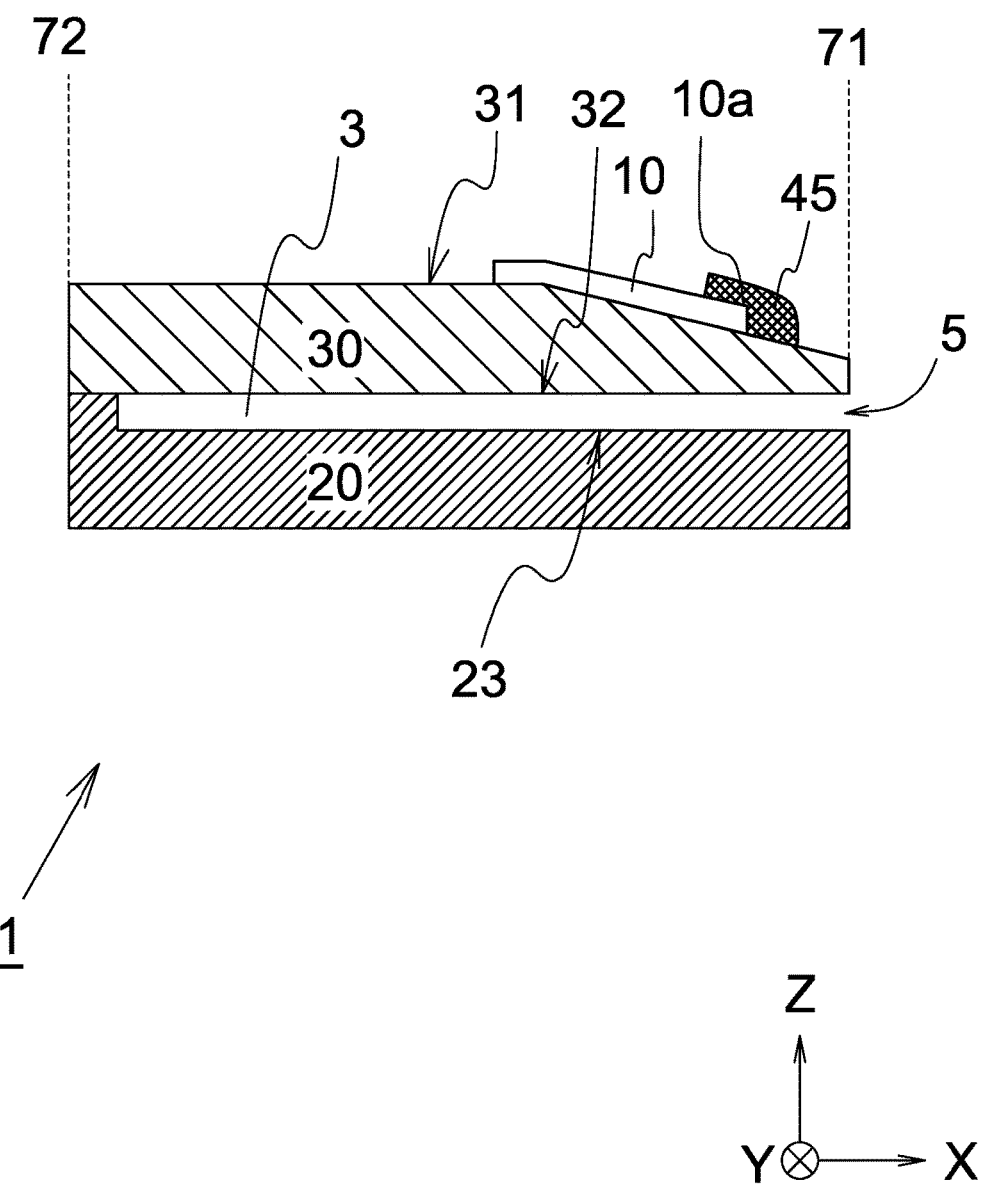
FIG. 17D is a partially enlarged cross-sectional view schematically illustrating another configuration of one embodiment of the dielectric barrier discharge plasma generator.

<3>The plasma generator 1 of the modification illustrated in FIG. 17D includes an insulating film 45 covering the first electrode 10 at the +X-side end portion 10a of the first electrode 10. With this configuration, unnecessary discharge such as the occurrence of corona discharge can be inhibited. Examples of the insulating film 45 include glass, a sintered body containing glass, and a resin material such as silicone and epoxy.

Figure 17E:
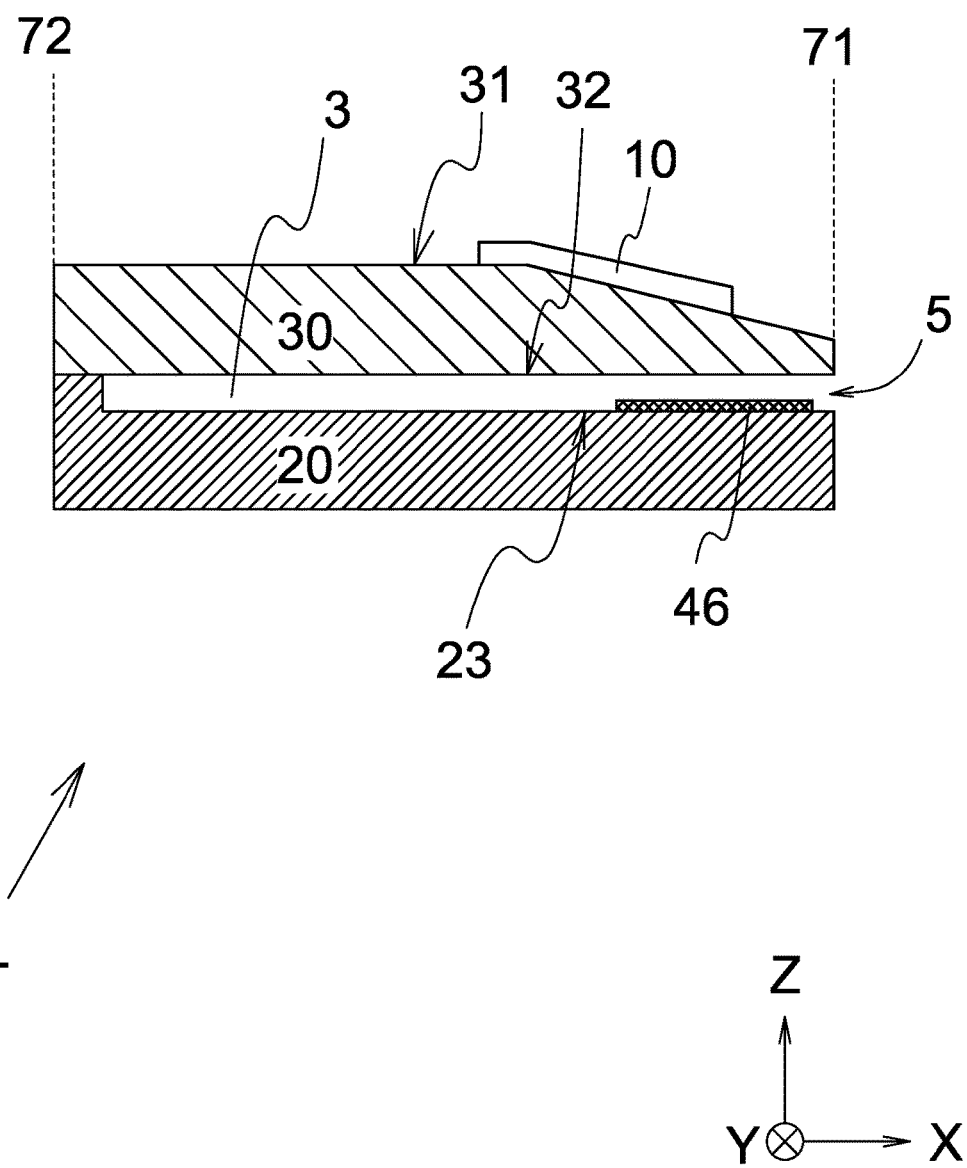
FIG. 17E is a partially enlarged cross-sectional view schematically illustrating another configuration of one embodiment of the dielectric barrier discharge plasma generator.

<4>The plasma generator 1 of the modification illustrated in FIG. 17E includes a protective layer 46 disposed on the third surface 23 of the second electrode 20 near the first end 71, that is, near the outlet 5. The protective layer 46 is preferably a dielectric, and more preferably the same material as the material of the dielectric substrate 30. Specific examples of the material of the protective layer 46 include aluminum oxide, aluminum nitride, steatite, and the like.

A method of forming the protective layer 46 on the third surface 23 of the second electrode 20 is not particularly limited, but a method of thermally spraying and applying a constituent material of the protective layer 46 can be adopted as an example. The thickness of the protective layer 46 can be appropriately set from the viewpoint of preventing contamination, and is, for example, 100 µm or less.

According to the plasma generator 1 of the modification illustrated in FIG. 17E, since the protective layer 46 is provided near the outlet 5, in other words, near a location where plasma is generated, it is possible to inhibit the evaporation and diffusion of the constituent material of the second electrode 20. This makes it possible to prevent the contamination of the object to be treated, onto which the plasma gas G1 is blown.

Figure 17F:
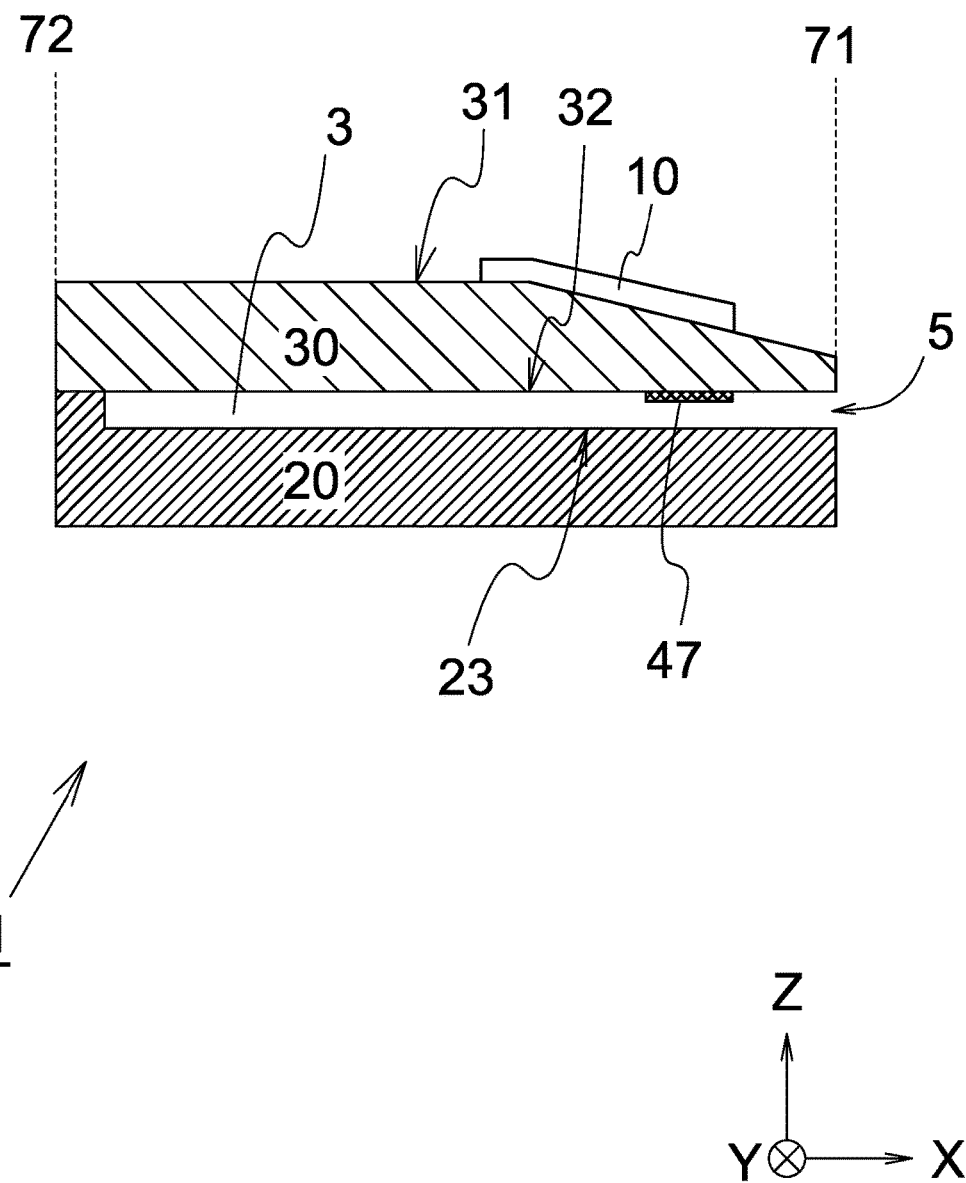
FIG. 17F is a partially enlarged cross-sectional view schematically illustrating another configuration of one embodiment of the dielectric barrier discharge plasma generator.

<5>The plasma generator 1 of the modification illustrated in FIG. 17F includes a startup assist member 47 disposed on the second surface 32 of the dielectric substrate 30 near the first end 71, that is, near the outlet 5.

Examples of the material of the startup assist member 47 include carbon, a transition metal compound, and the like. In addition, examples of the material of the startup assist member 47 include a substance having a relative permittivity higher than that of the dielectric substrate 30. At this time, the constituent material of the startup assist member 47 is heated due to a dielectric loss, and the initial electrons are supplied into the gas flow path 3. Carbon is particularly preferable as the material of the startup assist member 47. Since carbon has high thermal stability, the evaporation of the startup assist member 47 is less likely to occur even when the temperature rises, thus improving the reliability as the plasma generator 1.

Note that the material of the startup assist member 47 may be a material having a low work function so that an electron emission action is recognized at a lower applied voltage.

According to the plasma generator 1 of the modification illustrated in FIG. 17F, since the startup assist member 47 is provided near the outlet 5, the initial electrons can be supplied into the gas flow path 3, thus improving the startup performance. This eliminates the need for a microwave oscillation device or a starter circuit device having a large power supply capacitance, and enables the manufacturing of the plasma generator 1 compactly and inexpensively.

Figure 17G:
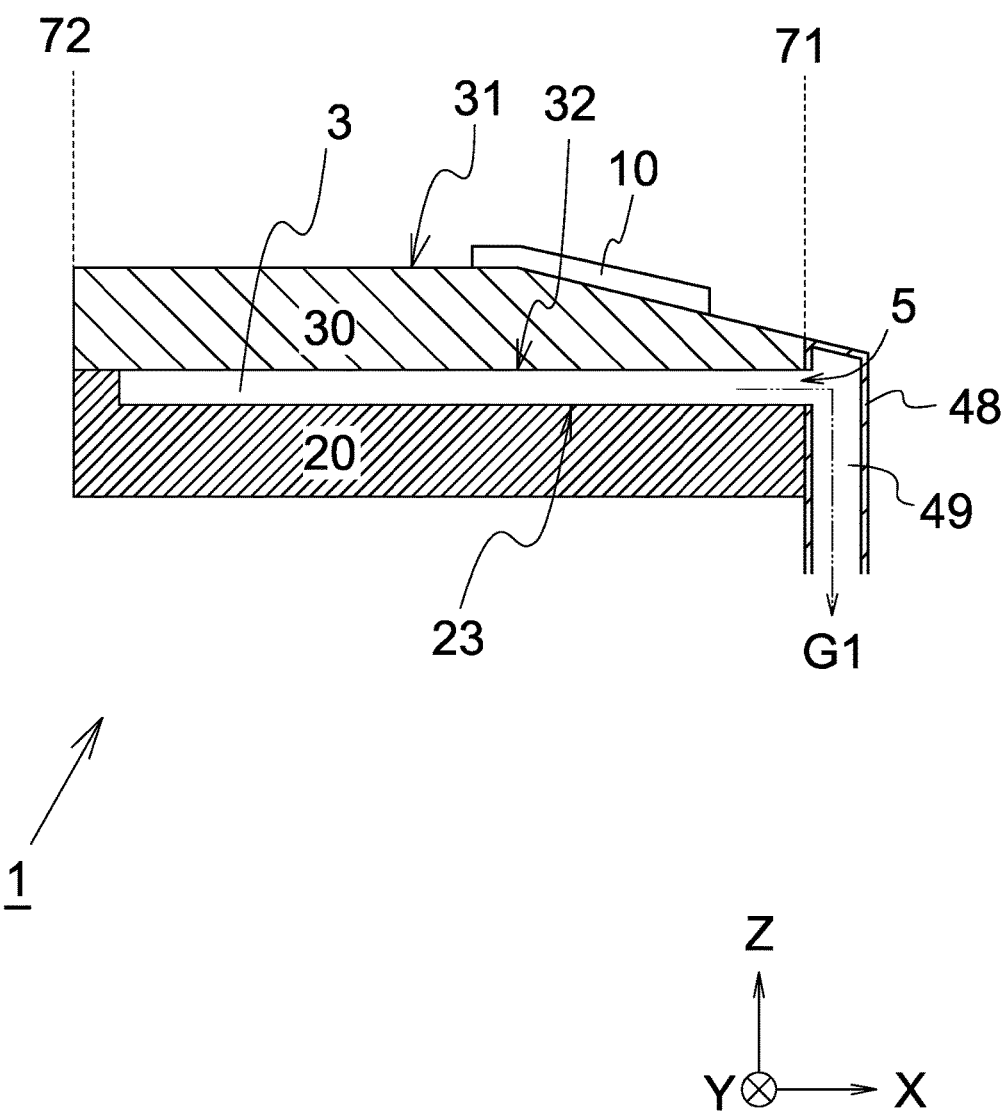
FIG. 17G is a partially enlarged cross-sectional view schematically illustrating another configuration of one embodiment of the dielectric barrier discharge plasma generator.
Figure 18:
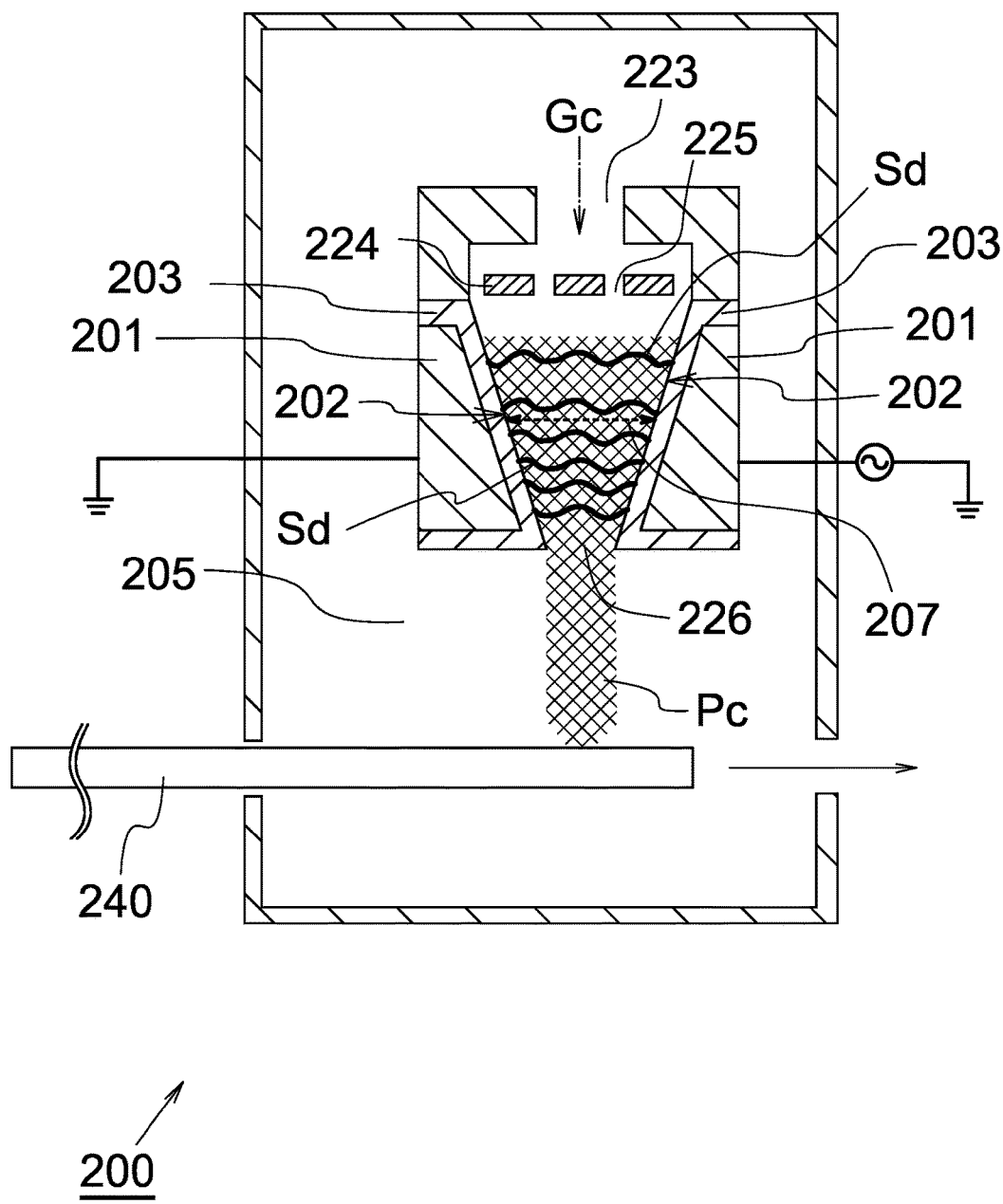
FIG. 18 is a cross-sectional view schematically illustrating a conventional dielectric barrier discharge plasma generator.

<6>The plasma generator 1 of the modification illustrated in FIG. 17G includes a light shielding member 48 adjacent to the outlet 5 on the +X side. The light shielding member 48 includes a tube 49 through which a gas can flow, and the tube 49 is communicated to the gas flow path 3. In the example illustrated in FIG. 17G, the blowing direction of the plasma gas G1 is changed to the −Z direction by the tube 49. With such a configuration, the object to be treated is prevented from being irradiated with the light derived from the discharge in the gas flow path 3.

<7>Note that the modifications described above can be appropriately combined.

Operation Method

When the plasma generator 1 described above is operated, first, at startup, one or more kinds of starting gases selected from the group consisting of He, Ne, and Ar are introduced into the gas flow path 3 to generate plasma in the gas flow path 3.

Thereafter, the treatment gas G0 is introduced into the gas flow path 3. The treatment gas G0 is appropriately selected according to the content of treatment to be performed on the object to be treated, and for example, a gas capable of generating a desired active species, such as hydrogen, oxygen, water, or nitrogen, is used. According to such a method, even when the treatment gas G0 is a gas from which plasma discharge is relatively difficult, the plasma gas G1 containing the substance of the treatment gas G0 can be blown onto the object to be treated.

DESCRIPTION OF REFERENCE SIGNS

1 Dielectric barrier discharge plasma generator
3 Gas flow path
5 Outlet
10 First electrode
10a, 10b End portion of first electrode
20 Second electrode
23 Surface of second electrode (third surface)
26 Outer edge
27 Recess
30 Dielectric substrate
31 Surface of dielectric substrate (first surface)
32 Surface of dielectric substrate (second surface)
40 Gas buffer substrate
51 Gap
53 Contact hole
61 Gas delivery device
63 Light source device
71 First end
72 Second end
81 First reference location
82 Second reference location
83 Third reference location
91 First specific area
92 Second specific area
93 Third specific area

The invention claimed is:
1. A dielectric barrier discharge plasma generator comprising:
a dielectric substrate that exhibits a plate shape extending in a first direction and has a first surface and a second surface located on an opposite side of the first surface in a second direction orthogonal to the first direction;
a first electrode disposed on the dielectric substrate on a side of the first surface;

a second electrode disposed at a position separated from the second surface of the dielectric substrate in the second direction;

a gas flow path that is formed by a gap between the dielectric substrate and the second electrode and through which a gas flows in a third direction orthogonal to the first direction and the second direction; and an outlet provided at a first end and extending in the first direction, the first end being one end portion of the gas flow path in the third direction, wherein the first surface of the dielectric substrate is a flat surface parallel to the third direction, extending at least from a second end to a first reference location, the second end being an end portion opposite to the outlet in the third direction, the second surface of the dielectric substrate is a flat surface parallel to the third direction, extending at least from the second end to a second reference location in the third direction, a third surface is a flat surface parallel to the third direction, extending at least from the second end to a third reference location in the third direction, the third surface being a main surface of the second electrode that faces the second surface of the dielectric substrate via the gas flow path, at least one of the first surface in a first specific area from the first reference location to the first end, the second surface in a second specific area from the second reference location to the first end, or the third surface in a third specific area from the third reference location to the first end is an inclined surface in the third direction, the first electrode is disposed at least between the first reference location and the first end, and when viewed in the first direction, an angle α formed by the first surface in the first specific area and the third direction, an angle β formed by the second surface in the second specific area and the third direction, and an angle γ formed by the third surface in the third specific area and the third direction satisfy both of Formula (1) and Formula (2) below:

[Math 1]

$$\sin \alpha + (\varepsilon_r - 1) \sin \beta - \varepsilon_r \sin \gamma < 0 \quad (1)$$

$$A_\alpha \sin \alpha + d1(0) > A_\beta \sin \beta > A_\gamma \sin \gamma - d2(0) \quad (2)$$

(where $\varepsilon_r$ in Formula (1) is a relative permittivity of the dielectric substrate, and in Formula (2), $A_\alpha$, $A_\beta$, and $A_{65}$ respectively correspond to lengths of the first specific area, the second specific area, and the third specific area in the third direction, and d1(0) represents a thickness of the dielectric substrate in the second direction at a reference location on a side closer to the second end in the third direction, the reference location being one of the first reference location or the second reference location, and d2(0) represents a height of the gas flow path in the second direction at a reference location on a side closer to the second end in the third direction, the reference location being one of the second reference location or the third reference location.).

2. The dielectric barrier discharge plasma generator according to claim 1, wherein the dielectric substrate exhibits a shape in which a thickness of the dielectric substrate in the second direction is constant regardless of a position in the third direction, or a thickness of the dielectric substrate in the second direction gradually increases from the first reference location toward the first end.

3. The dielectric barrier discharge plasma generator according to claim 1, wherein the first electrode is a high-voltage side electrode, and the second electrode is a low-voltage side electrode.

4. The dielectric barrier discharge plasma generator according to claim 1, further comprising:

a gas buffer substrate in contact with the second electrode at a peripheral edge from a position opposite to the dielectric substrate;

a gas delivery device that introduces the gas into a gap sandwiched between the gas buffer substrate and the second electrode; and a plurality of contact holes penetrating the second electrode in the second direction at each of a plurality of locations that differ in the first direction.

5. The dielectric barrier discharge plasma generator according to claim 4, wherein the plurality of contact holes are located closer to the second end than the first electrode in the third direction.

6. The dielectric barrier discharge plasma generator according to claim 1, wherein a main material of the dielectric substrate is aluminum oxide or aluminum nitride.

7. The dielectric barrier discharge plasma generator according to claim 1, wherein the first electrode is disposed at a position retracted from the first end toward the second end by a distance of less than 10 mm in the third direction.

* * * * *